United States Patent
Zhu et al.

(10) Patent No.: US 12,367,940 B2
(45) Date of Patent: Jul. 22, 2025

(54) SIMULTANEOUS LOWER TAIL VERIFY WITH UPPER TAIL VERIFY

(71) Applicant: Western Digital Technologies, Inc., San Jose, CA (US)

(72) Inventors: Yingying Zhu, Shanghai (CN); Chao Xu, Shanghai (CN); Ming Wang, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 56 days.

(21) Appl. No.: 18/365,894

(22) Filed: Aug. 4, 2023

(65) Prior Publication Data
US 2025/0046388 A1    Feb. 6, 2025

(51) Int. Cl.
  *G11C 16/28*  (2006.01)
  *G11C 16/10*  (2006.01)
  *G11C 16/34*  (2006.01)

(52) U.S. Cl.
  CPC ........ *G11C 16/3459* (2013.01); *G11C 16/102* (2013.01); *G11C 16/28* (2013.01); *G11C 16/3404* (2013.01); *G11C 16/3486* (2013.01)

(58) Field of Classification Search
  CPC ... G11C 16/3459; G11C 16/102; G11C 16/28; G11C 16/3404; G11C 16/3486
  See application file for complete search history.

(56) References Cited

U.S. PATENT DOCUMENTS

| | | |
|---|---|---|
| 7,215,575 B2 | 5/2007 | Chen et al. |
| 8,842,476 B2 | 9/2014 | Sakai et al. |
| 9,576,673 B2 | 2/2017 | Jiang et al. |
| RE46,573 E | 10/2017 | Sharon et al. |
| 9,922,719 B2 | 3/2018 | Li et al. |
| 10,249,382 B2 | 4/2019 | Lee et al. |
| 2022/0392553 A1* | 12/2022 | Wang ............... G11C 16/0483 |

\* cited by examiner

*Primary Examiner* — Xiaochun L Chen
(74) *Attorney, Agent, or Firm* — Pearl Cohen Zedek Latzer Baratz LLP

(57) ABSTRACT

Technology is disclosed herein for simultaneous lower tail program verify with upper tail verify. The memory system may apply a reference voltage to a word line following applying a program voltage to the word line. The memory system senses the first set of memory cells targeted for a first data state and the second set of memory cells targeted for a second data state. The memory system determines whether memory cells in the first set have a Vt greater than a maximum target Vt for the first data state based on the sensing of the first set of memory cells. The memory system also determines whether memory cells in the second set have a Vt less than a minimum target Vt for the second data state based on the sensing of the second set of memory cells.

17 Claims, 21 Drawing Sheets

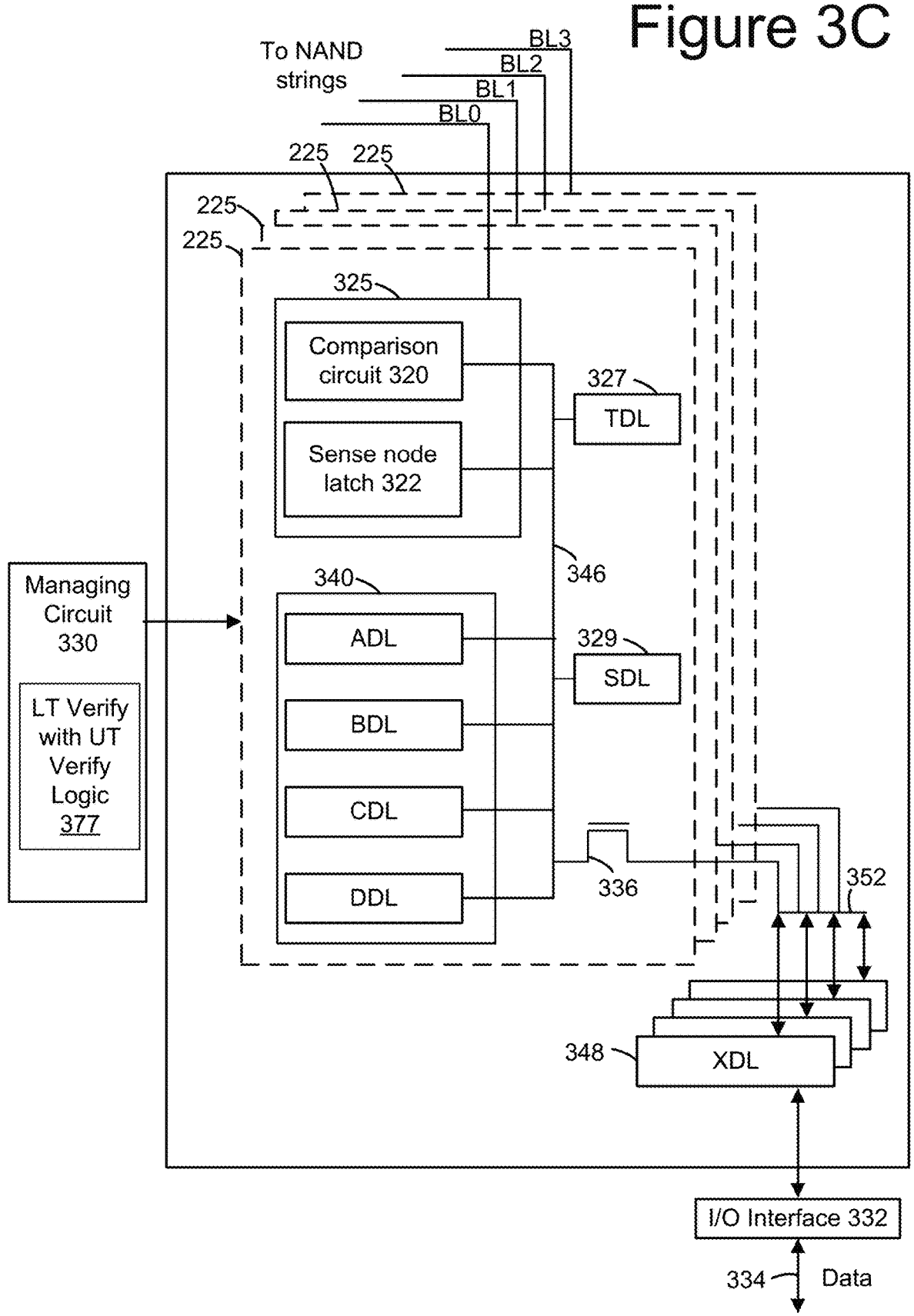

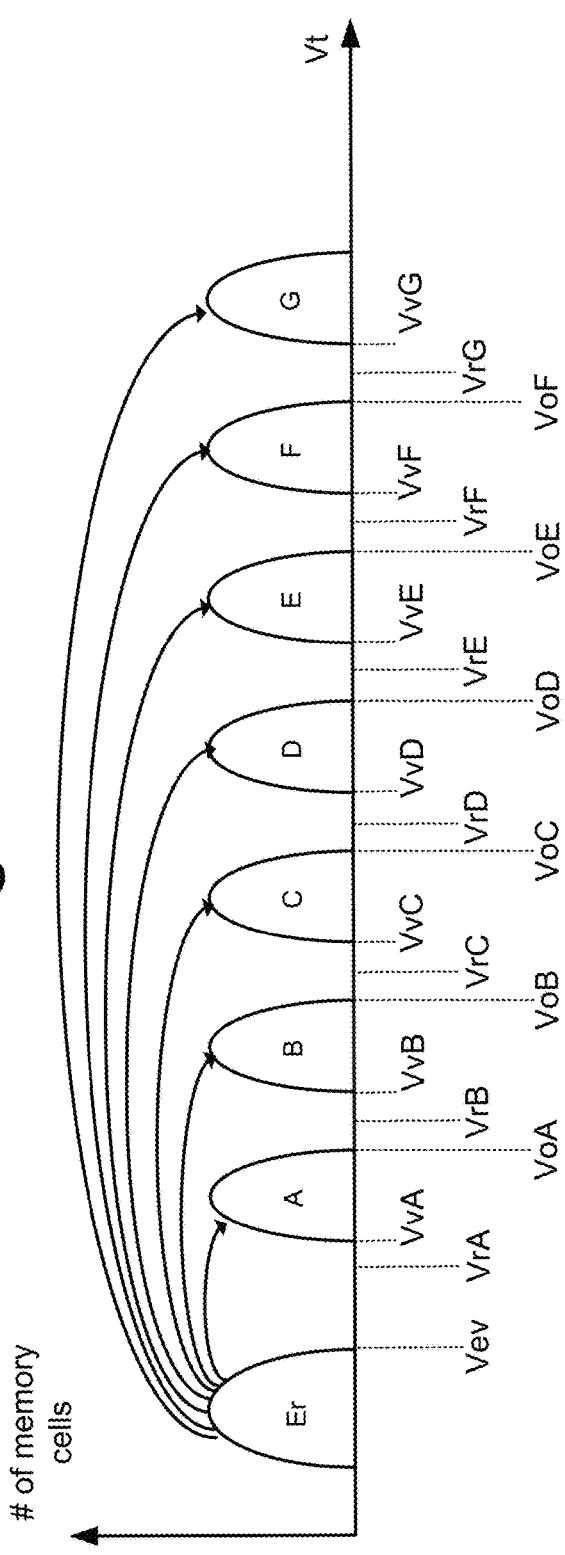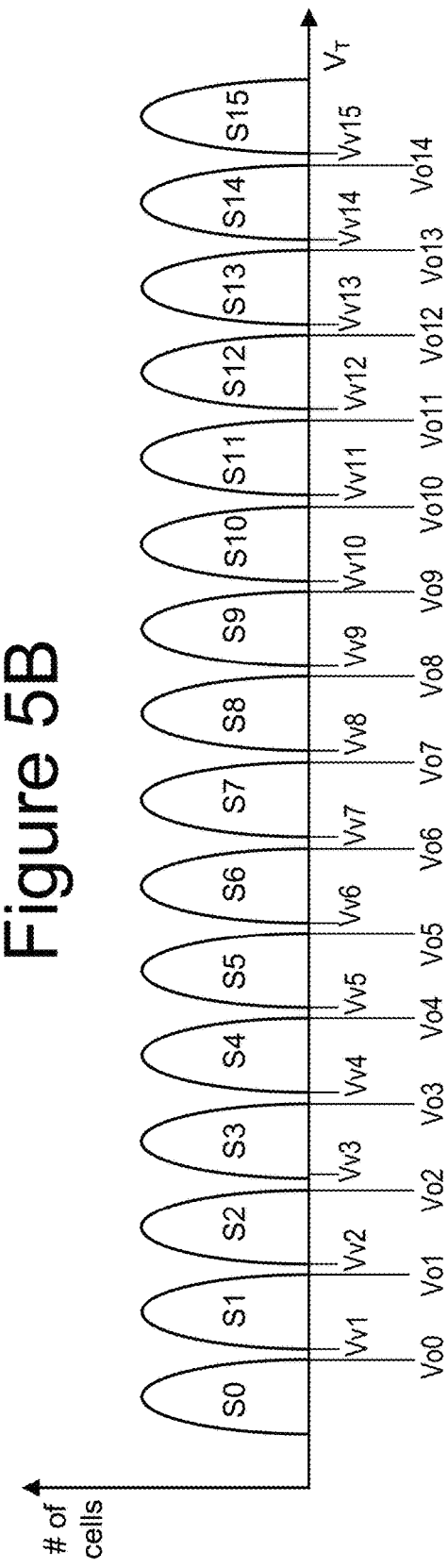

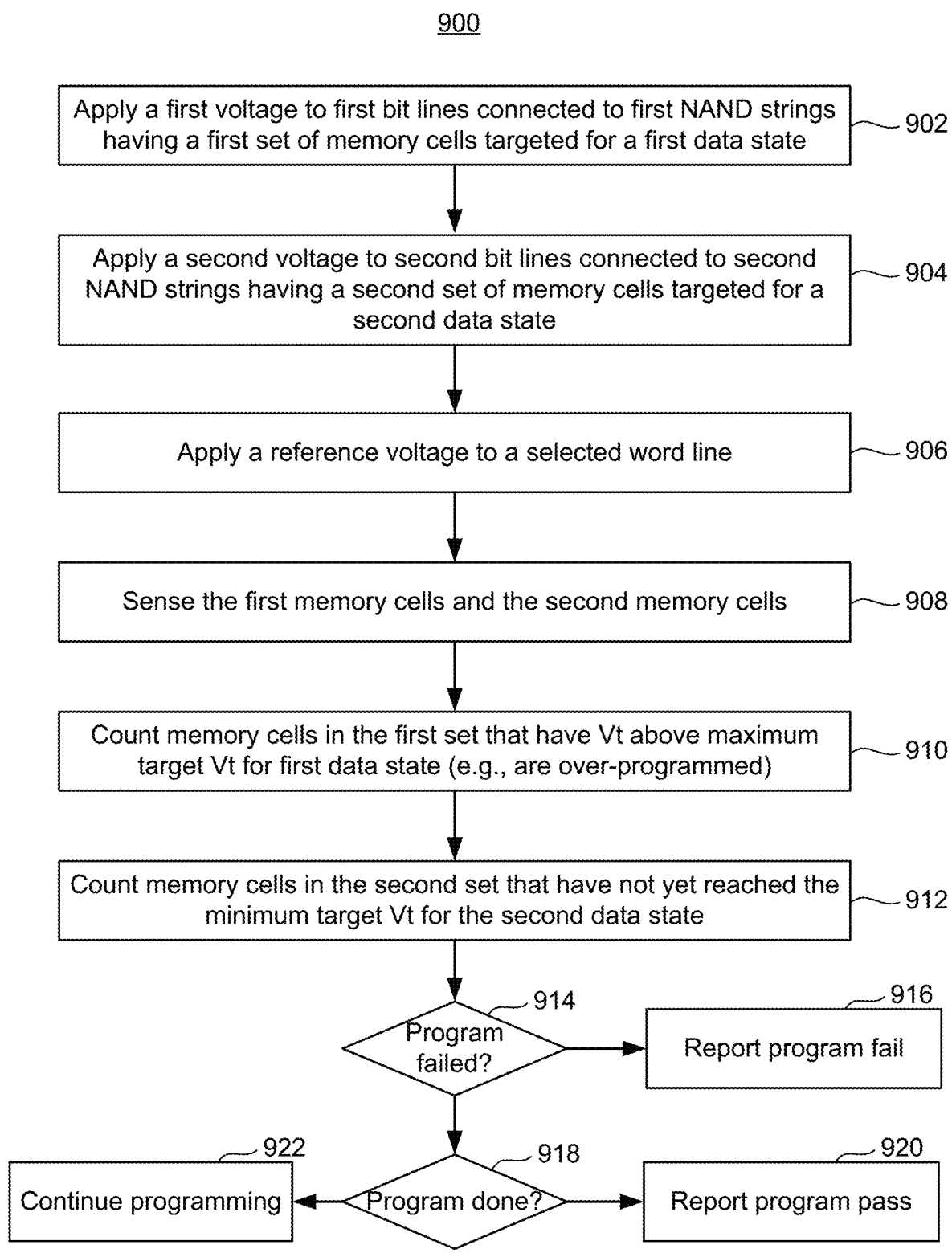

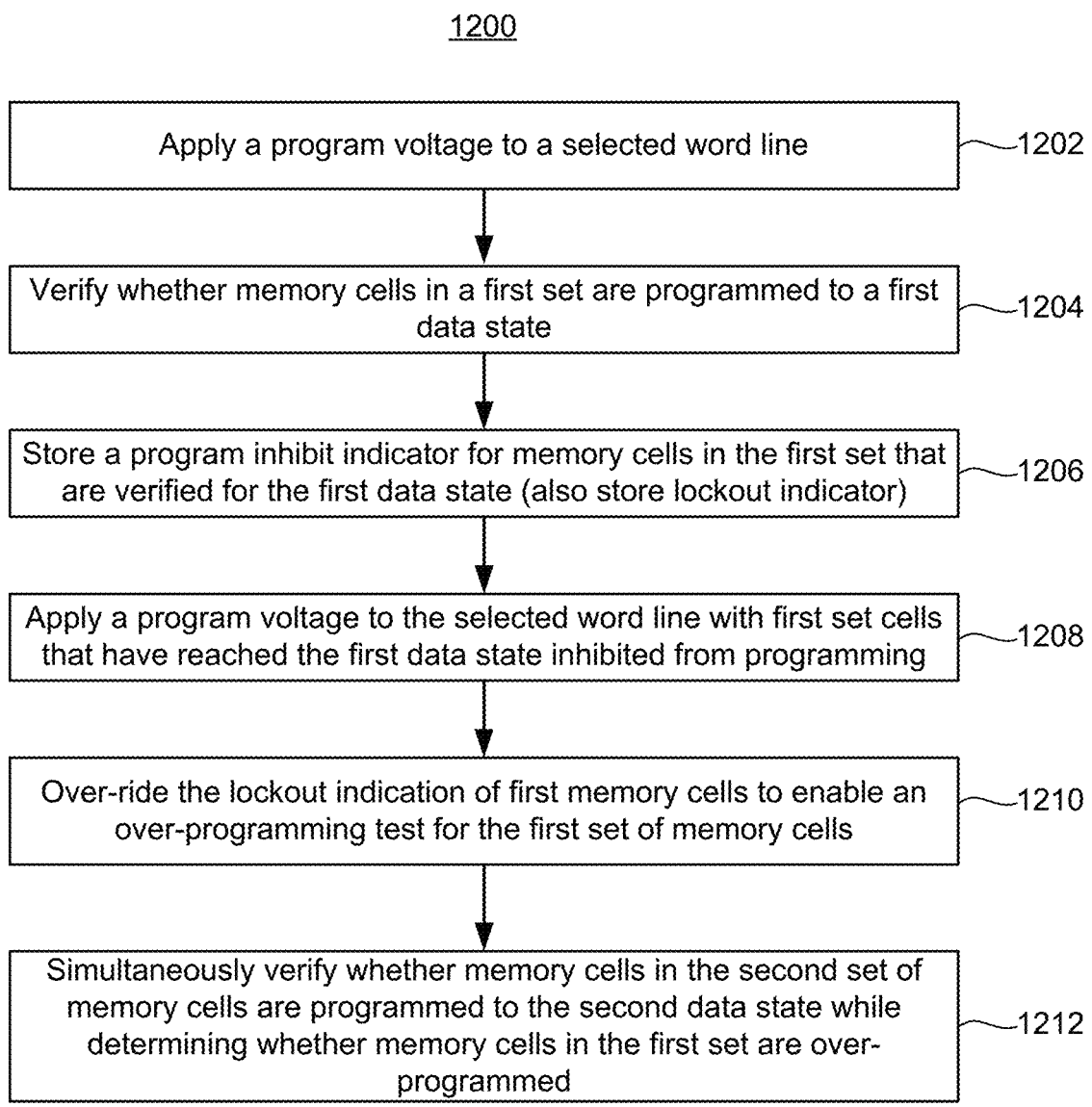

US 12,367,940 B2

SIMULTANEOUS LOWER TAIL VERIFY WITH UPPER TAIL VERIFY

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be arranged into units that are referred to as blocks. For example, a block in a NAND memory system contains many NAND strings. A NAND string contains memory cell transistors connected in series, a drain side select gate at one end, and a source side select gate at the other end. Each select gate may have one or more transistors in series. Each NAND string is associated with a bit line. The block typically has many word lines that provide voltages to the control gates of the memory cell transistors. In some architectures, each word line connects to the control gate of one memory cell on each respective NAND string in the block.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

The NAND programming process typically includes multiple program loops, wherein each program loop includes applying a program pulse followed by verifying one or more of the data states. Verifying for a given data state includes testing whether memory cells that are targeted for that data state have a Vt at or above a verify reference voltage for that data state. Verifying may include counting how many memory cells that are targeted for the data state still have a Vt below the verify reference voltage for that data state. After the targeted Vt has been reached for a memory cell, further programming of the memory cell is inhibited. If not enough memory cells reach their targeted data state after reaching a maximum program loop, the programming process fails.

Programming may result in some of the memory cells being over-programmed. A NAND memory cell is over-programmed if its Vt is higher than a maximum target Vt for its programmed state. FIG. 1A depicts eight threshold voltage (Vt) distributions for a corresponding eight data states illustrating one example of over-programming. The eight data states includes an erased state (Er) and seven programmed states (A, B, C, D, E, F, G). During programming the memory cells are verified with respect to the appropriate verify reference voltage (VvA, VvB, VvC, VvD, VvE, VvF, or VvG). Read reference voltages (VrA, VrB, VrC, VrD, VrE, VrF, and VrG) may be used during read to determine which data state a memory cell is in. The definition of what constitutes an over-programmed memory cell can vary; however, a memory cell that has been targeted to one data state but has a Vt above the read reference voltage of a higher Vt data state is typically considered to be over-programmed. For example, memory cells targeted for the A-state but having a Vt above VrB are typically considered over-programmed. Note that the definition of an over-programmed cell is not required to be exactly at the read reference voltage of the next higher data state. Verifying whether a memory cell has a Vt of at least the targeted verify voltage does not test for the memory cells being over-programmed. Over-programmed memory cells can lead to read errors. For example, a memory cell targeted for the A-state but having a Vt above VrB may be read as being in the B-state. The memory system has error correction capabilities that are able to handle some read errors. However, handling read errors adds to the read time. Also, too many read errors can result in a read failure.

In some cases, after the programming process the Vt of erase state memory cells can also end up higher than a maximum target Vt. FIG. 1B depicts eight threshold voltage (Vt) distributions for a corresponding eight data states illustrating an example in which some erase state memory cells have a Vt above a maximum target Vt. During erase the memory cells will be verified with respect to the erase verify level (VeV). However, the programming process could unintentionally disturb some of those erase state cells, thereby increasing their Vt. Erase state cells have a Vt above VrA may be read as being in the A-state, thereby leading to read errors. Such cells are sometimes referred to as Erase-to-A fails.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIG. 5A depicts a threshold voltage (Vt) distributions when each memory cells stores three bits.

FIG. 5B depicts a threshold voltage (Vt) distributions when each memory cells stores four bits.

FIG. 9 is a flowchart of one embodiment of a process for counting over-programmed memory cells and counting under-programmed memory cells based on applying the same reference voltage to a selected word line.

FIG. 12 is a flowchart of one embodiment of a process of programming memory cells that includes a simultaneous program verify with over-program detection.

DETAILED DESCRIPTION

Technology is disclosed herein for simultaneous lower tail program verify with upper tail verify. In an embodiment, the upper tail verify tests for over-programming of memory cells of one state while another state is being program verified. In an embodiment, the upper tail verify tests whether cells that are to remain in the erased state have too high of a Vt. In an embodiment, the memory system will apply a reference voltage to a word line following applying a program voltage to the word line. The word line is connected to a first set of memory cells targeted for a first data state and a second set of memory cells targeted for a second data state. The memory system senses the first set of memory cells and the second set of memory cells in response to applying the reference voltage to the word line. The memory system determines whether memory cells in the first set of memory cells have a Vt greater than a maximum target Vt for the first data state based on the sensing of the first set of memory cells. This test for a Vt above a maximum target Vt for a data state may be referred to herein as an upper tail verify. The memory system also determines whether memory cells in the second set of memory cells have a Vt less than a minimum target Vt for the second data state based on the sensing of the second set of memory cells. This test for a Vt below a minimum target Vt for a data state may be referred to herein as a lower tail verify. In an embodiment, the sensing of the first set of cells for the maximum target Vt for the first data state and the sensing of the second set of cells for the minimum target Vt for the second data state is simultaneous. In an embodiment, the memory system has over over-program detection for the first data state with simultaneous program verify for the second data state. Thus, time is saved by avoiding a test for over-program detection outside of the program verify phase. Note that if the over-program detection outside of the program verify were to be skipped to save time, then read errors could arise. In an embodiment, the memory system has Erase state to A-state fail detection with simultaneous program verify for a programmed data state. Hence, read errors can be reduced without extending programming time.

Figure 1A:
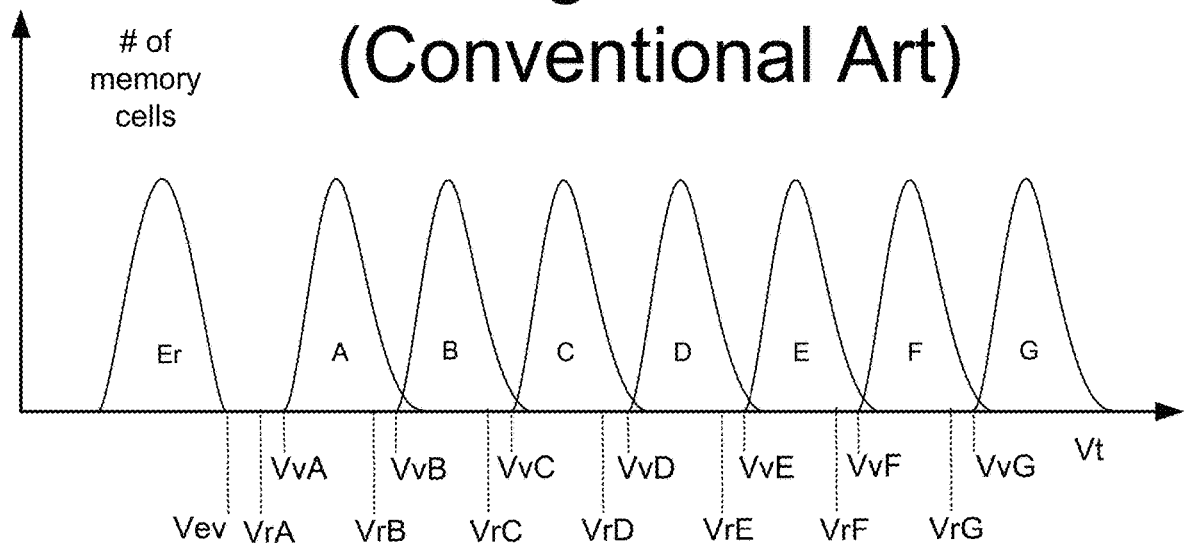
FIG. 1A depicts eight threshold voltage (Vt) distributions for a corresponding eight data states illustrating one example of over-programming.
Figure 1B:
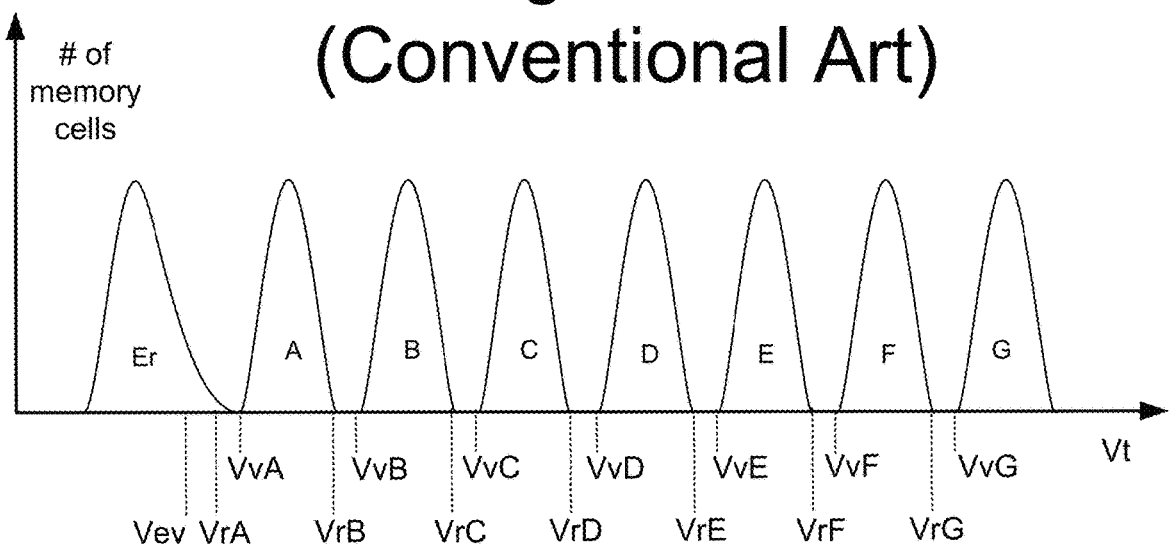
FIG. 1B depicts eight threshold voltage (Vt) distributions for a corresponding eight data states illustrating another example of over-programming.
Figure 2A:
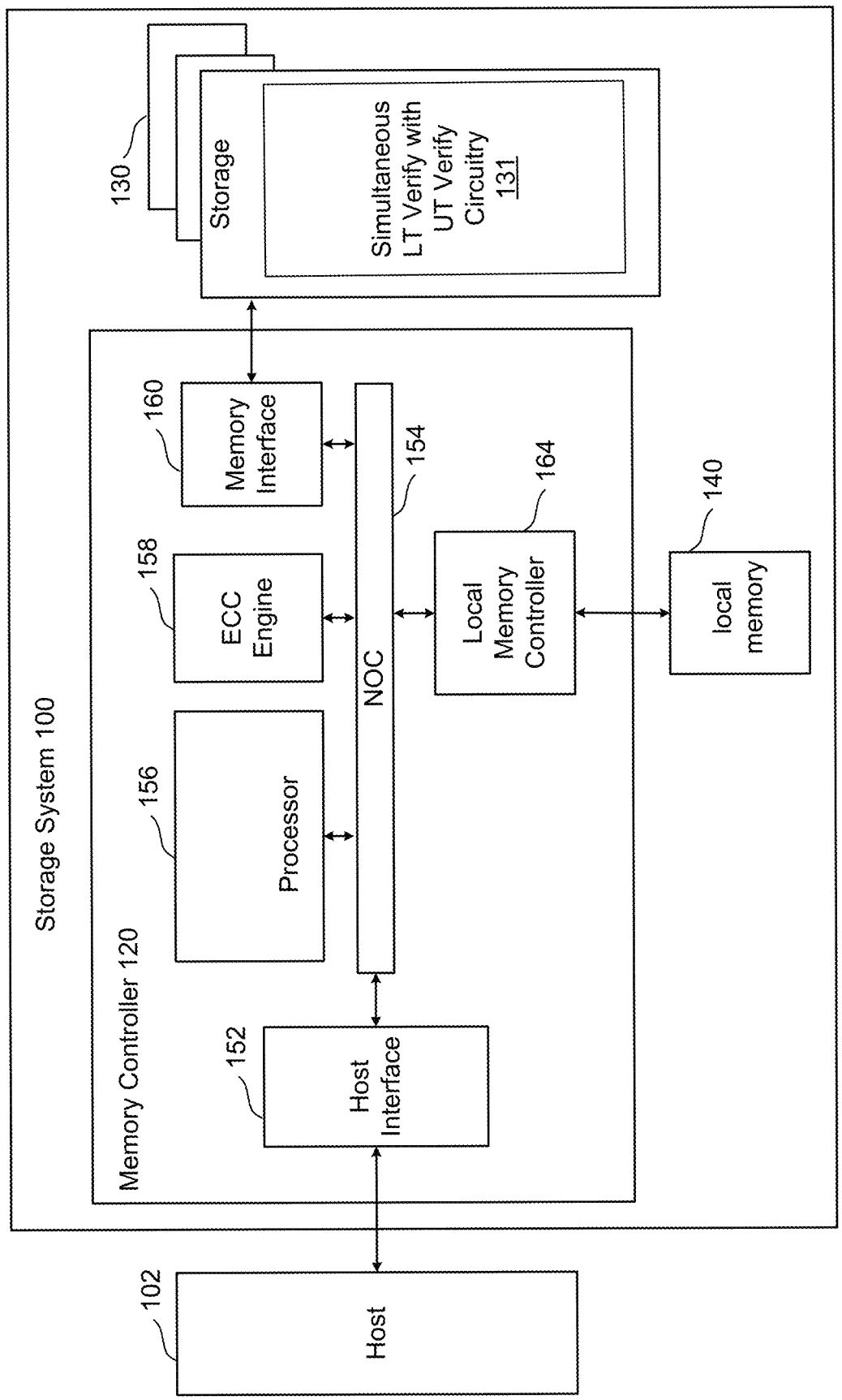
FIG. 2A is a block diagram depicting one embodiment of a storage system.

FIG. 2A is a block diagram of one embodiment of a storage system 100 that implements the technology described herein. The storage system 100 is configured to implement embodiments of simultaneous lower tail verify of one data state with upper tail verify of another data state. For example, the storage system 100 may program verify with simultaneous over-program detection as disclosed herein. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 2A are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory dies. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In an embodiment, the non-volatile storage 130 has simultaneous lower tail (LT) verify with upper tail (UT) verify circuitry 131. The circuitry 131 may program verify one data state and detect over-programed cells for another data state simultaneously. The circuitry 131 may program verify one data state and detect erase state cells having a Vt above a maximum target Vt simultaneously. Therefore, the circuitry 131 may reduce read errors without adding to programming time.

Figure 2B:
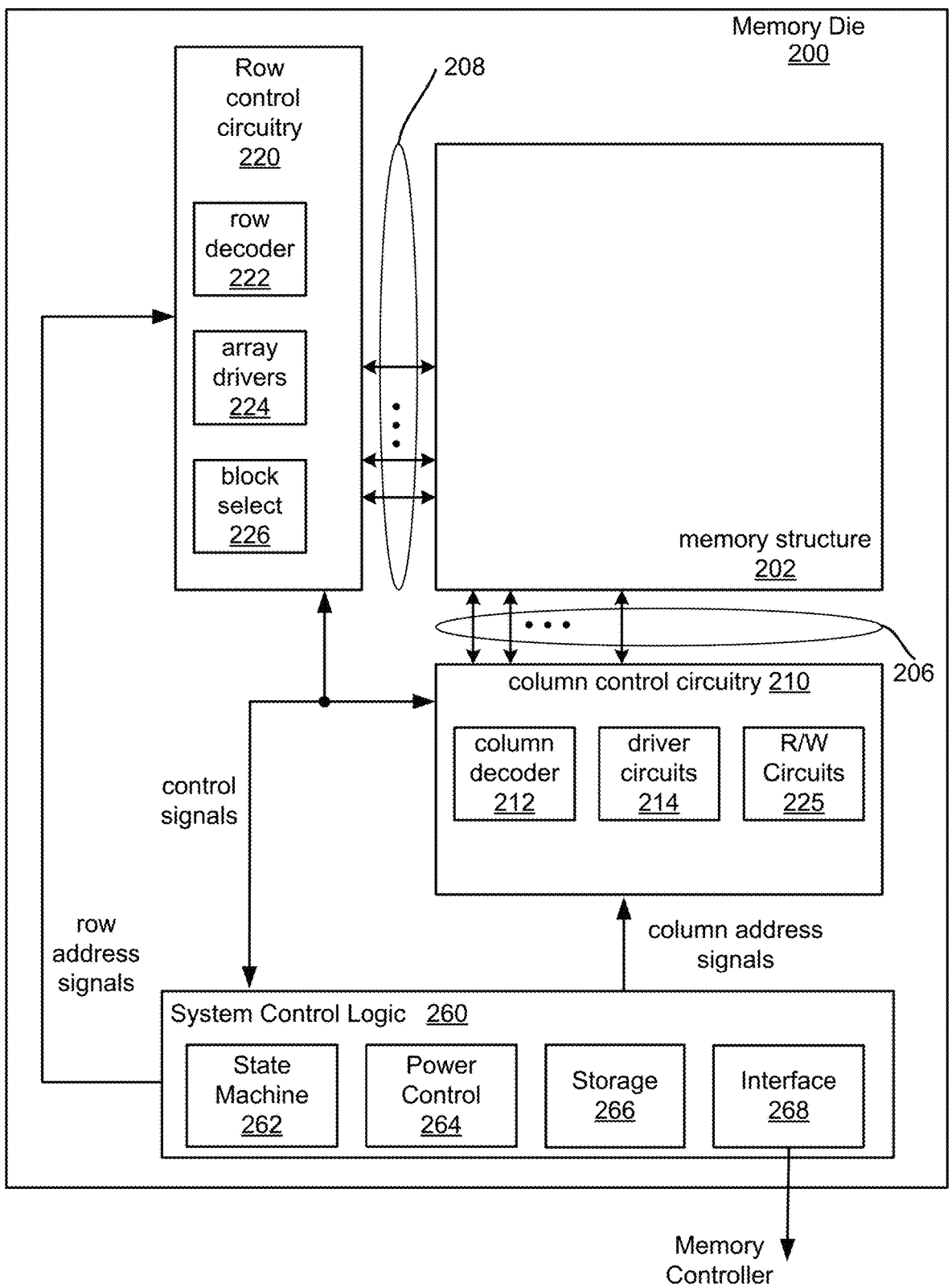
FIG. 2B is a block diagram of one embodiment of a memory die.

In one embodiment, non-volatile storage 130 comprises one or more memory dies. FIG. 2B is a functional block diagram of one embodiment of a memory die 200 that comprises non-volatile storage 130. Each of the one or more memory dies of non-volatile storage 130 can be implemented as memory die 200 of FIG. 2B. The components depicted in FIG. 2B are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. In one embodiment, the memory die 200 receives a command via memory controller interface 268 to perform a post-program erase.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2B can be grouped into two parts: (1) memory structure 202 and (2) peripheral circuitry, which includes all of the other components depicted in FIG. 2B. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2B onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on one die connected to the periphery elements on the other die. Although the following will focus on a bonded memory circuit of one memory die and one control die, other embodiments can use more dies, such as two memory dies and one control die, for example.

Figure 2C:
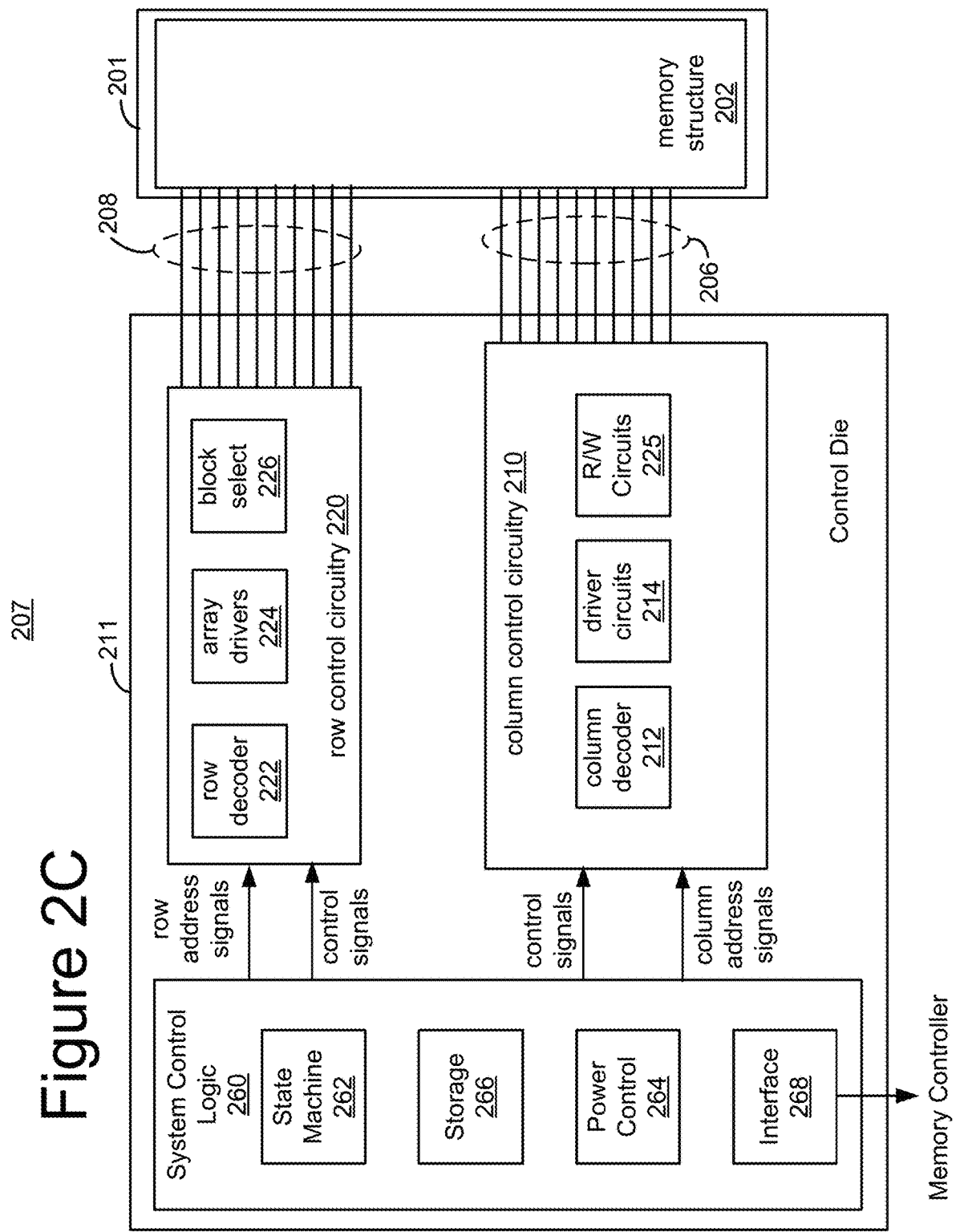
FIG. 2C is a block diagram of one embodiment of an integrated memory assembly.

FIG. 2C shows an alternative arrangement to that of FIG. 2B which may be implemented using wafer-to-wafer bonding to provide a bonded die pair. FIG. 2C depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2C shows an example of the peripheral circuitry, including control circuits, formed in a peripheral circuit or control die 211 coupled to memory structure 202 formed in memory structure die 201. Common components are labelled similarly to FIG. 2B. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2C shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include, but is not limited to, any one of or any combination of state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
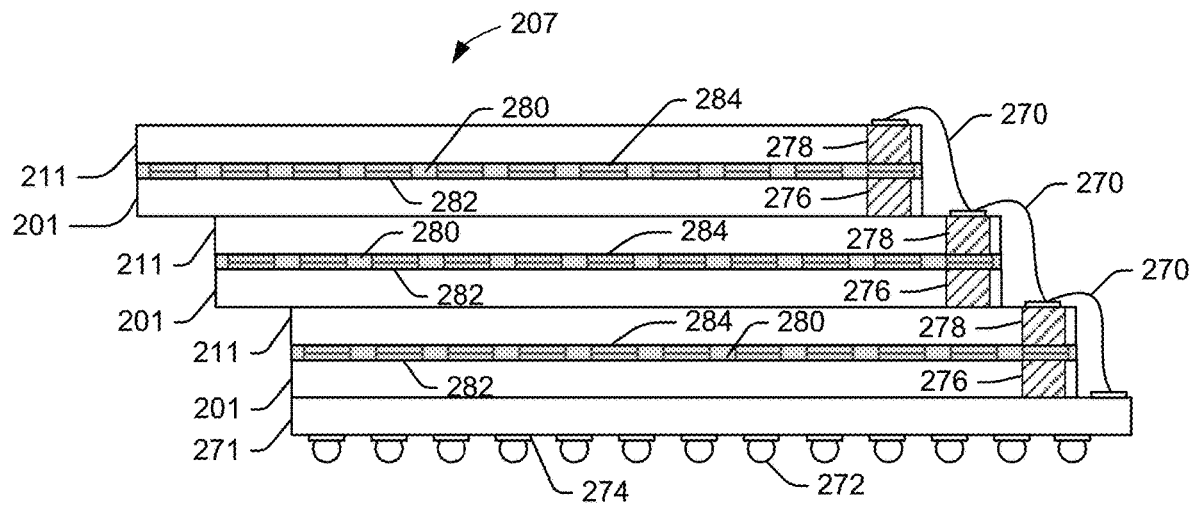
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
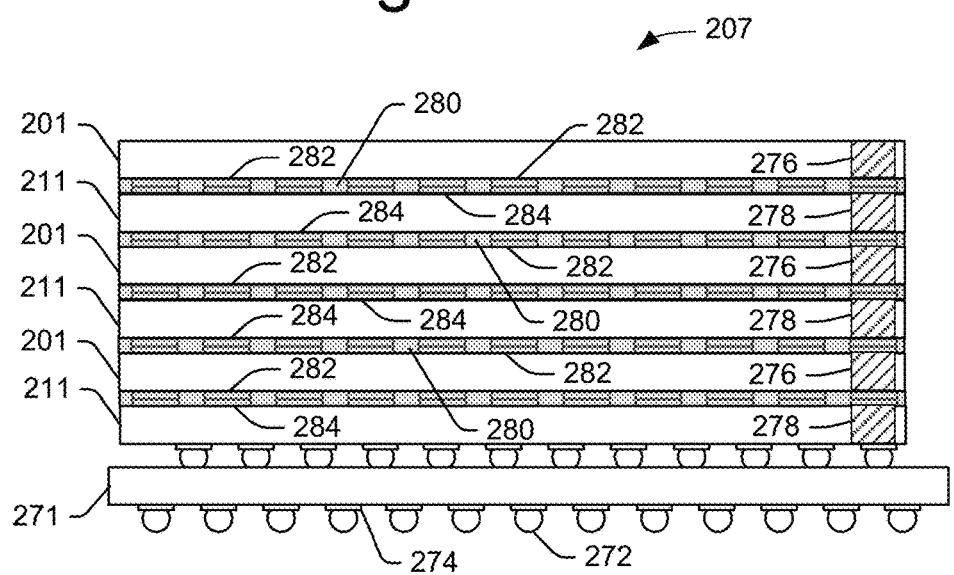

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In an embodiment, the managing circuit 330 has LT verify with UT verify logic 377 that may control the sense amplifier 325 and/or latches (e.g., data latches 340, SDL latch 329) to facilitate simultaneous LT verify with UT verify. However, LT verify with UT verify logic 377 may reside elsewhere. For example, all or a part of the logic that controls LT verify with UT verify logic 377 may reside in the state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. In one embodiment, the TDL latch 327 is used to control the magnitude of the voltage on the bit line. In one embodiment, during a simultaneous program verify of one state with an upper tail verify of another state, the TDL latch 329 has one value for a bit line voltage for program verify (or lower tail verify) and another value for upper tail verify. Note that the upper tail verify may be used to test for over-programmed memory cells.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. In one embodiment, the bit in the sense node latch 322 can also be used in a lockout scan to decide whether to set a bit line voltage to an inhibit or a program enable level in a next program loop. Optionally, a TDL latch 327 may be used to store the information used to set the bit line voltage. The bit in the TDL latch 327 can be used to decide whether to set a bit line voltage to a first sense voltage or a second sense voltage in UT verify of a first data state with LT verify of second data state.

The data latches 340 are coupled to the sense amplifier 325 by a local data bus 346. The data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell. In a four bit per memory cell embodiment, ADL stores a bit for a lower page of data, BDL stores a bit for a middle page of data, CDL stores a bit for an upper page of data, and DDL store a bit for a top page of data. In a three bit per memory cell embodiment, ADL stores a bit for a lower page of data, BDL stores a bit for a middle page of data, and CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller 120.

In one embodiment, the SDL latch 329 is used to control whether the memory cell associated with the sense amplifier will take part in the verify. In one embodiment, the content of the ADL, BDL, CDL (and DDL for four-bit) latches is used to set the SDL latch 329 such that the correct cells are included in a fail bit count (FBC) for the present data state being verified. In one embodiment, the verify includes a lower tail verify (e.g., normal verify) of one data state and an upper tail verify (e.g., over-program check) of another data state. In one such verify, the SDL latches 329 for the cells taking part in the upper tail verify may also be set such that those cells are included in the fail bit count (FBC). In an embodiment, the LT verify with UT verify logic 377 controls the SDL latch 329 to enable the UT verify of one data state with the LT verify of another data state.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
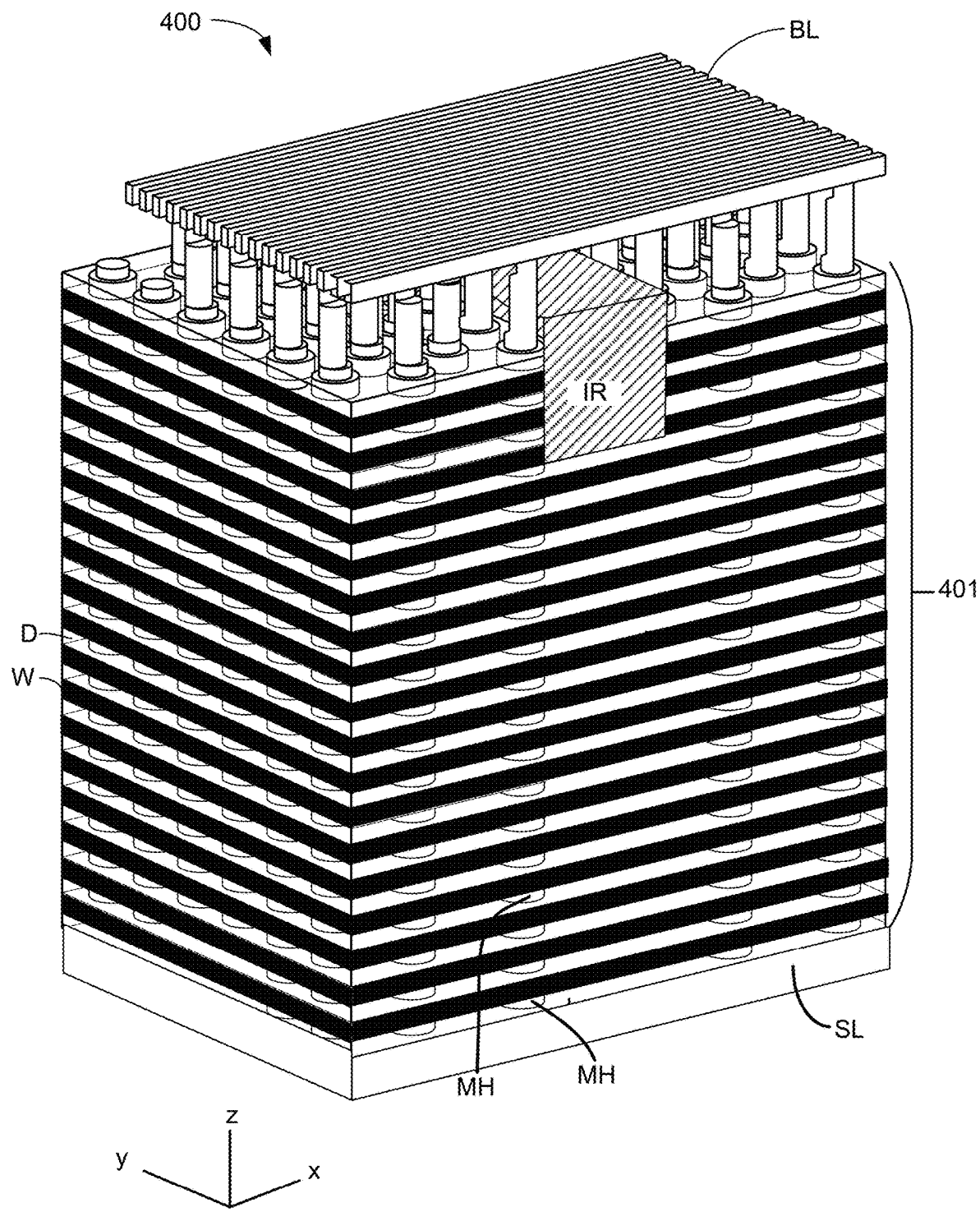
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
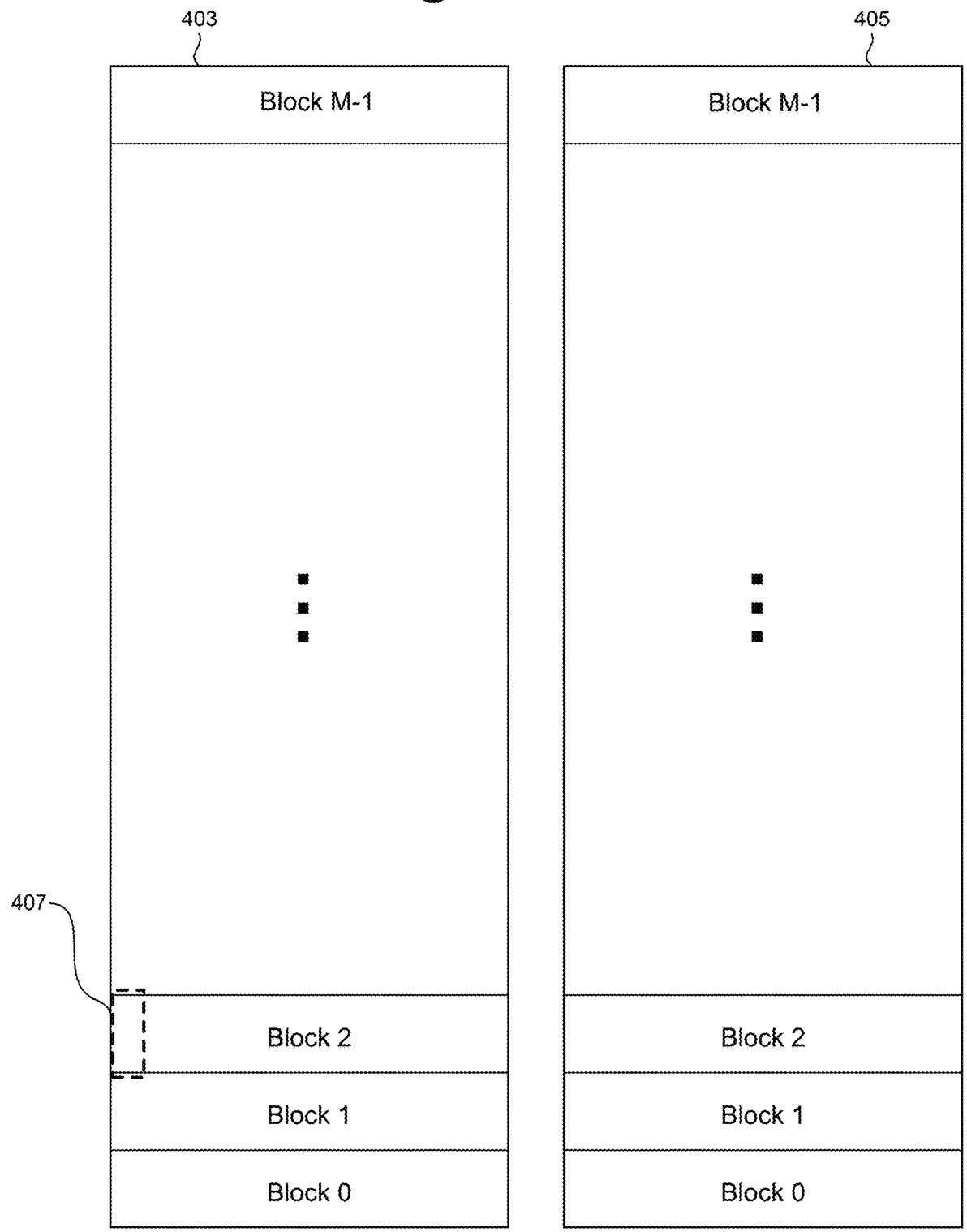
FIG. 4A is a block diagram of one example of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
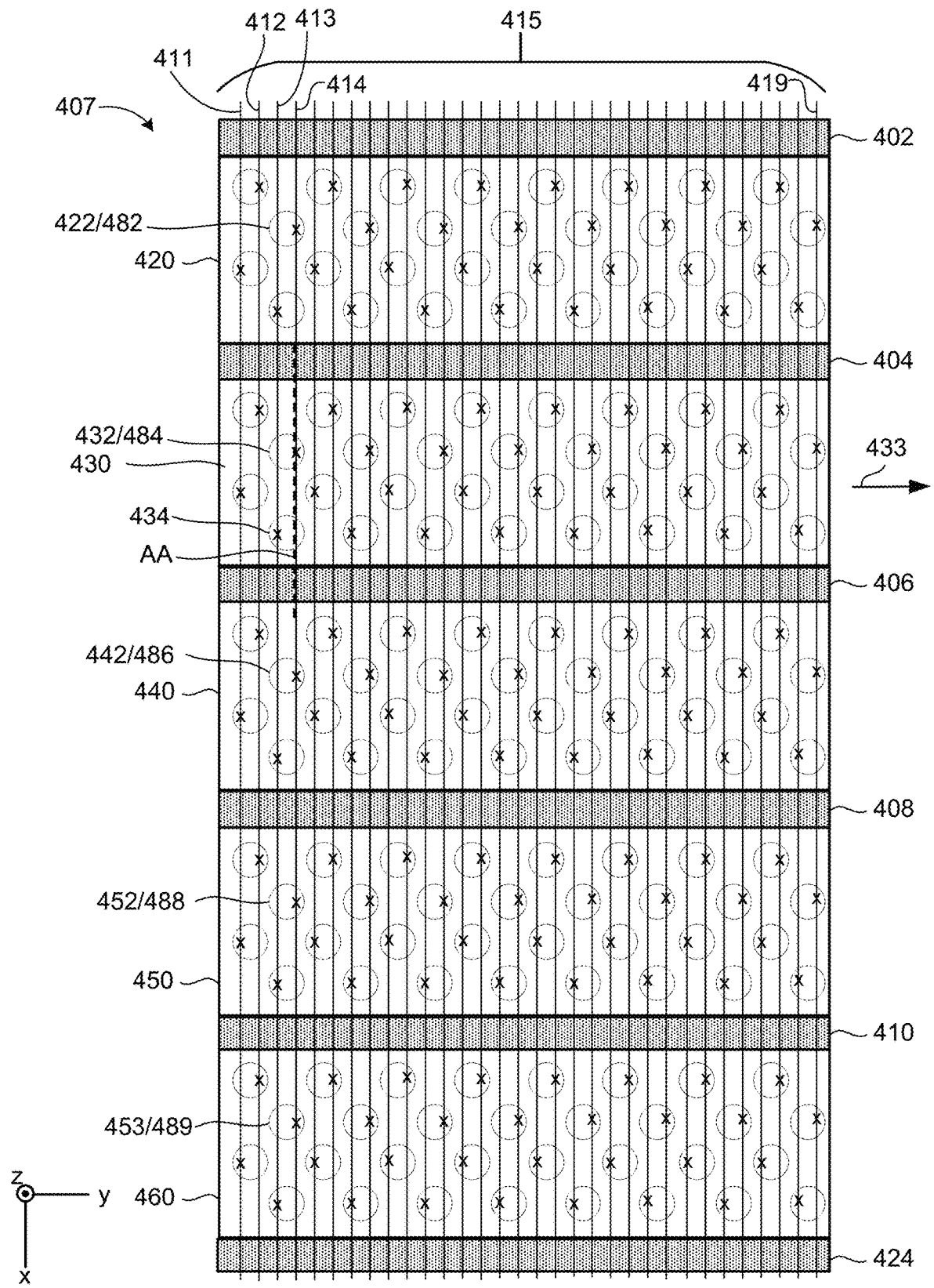
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2B and 2C. FIG. 4B is a diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, ... 419. FIG. 4B shows 32 bit lines because only a portion of the block is depicted. It is contemplated that more than 32 bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408, 410, and 424, which may be formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410.

In one example implementation, a bit line only connects to one vertical column/NAND string in each of regions (sub-blocks) 420, 430, 440, 450, and 460. In that implementation, each block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
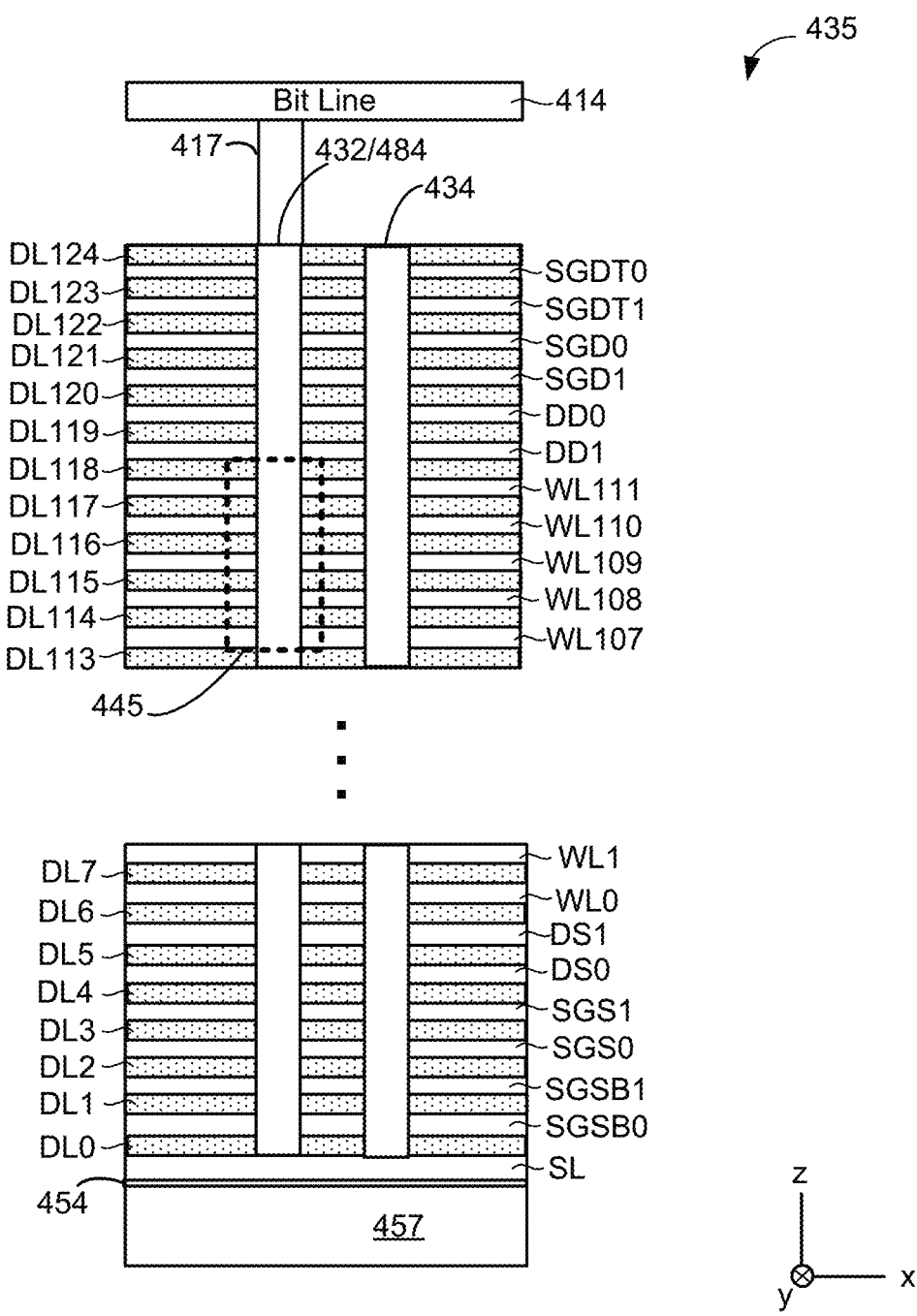
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
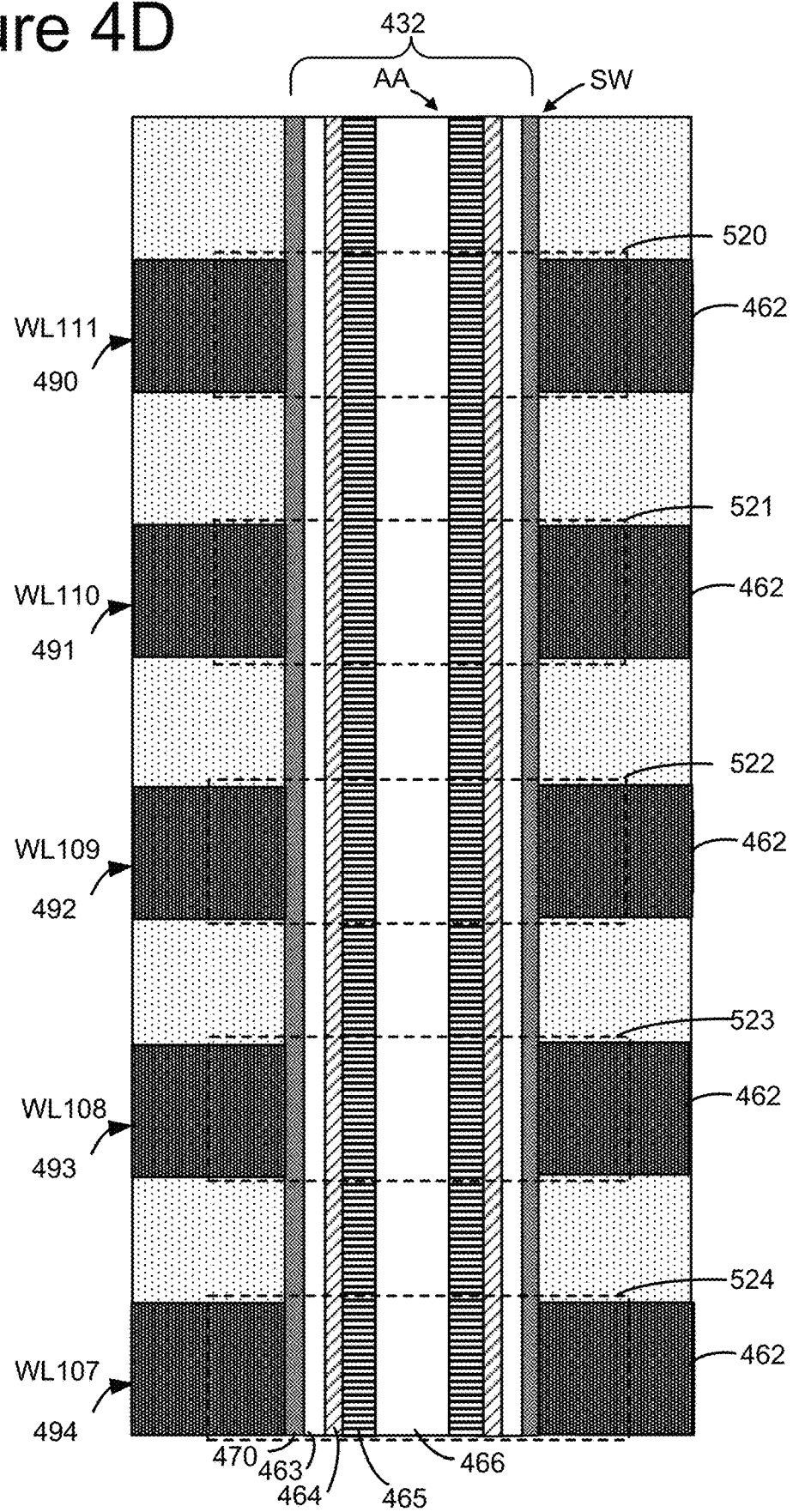
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
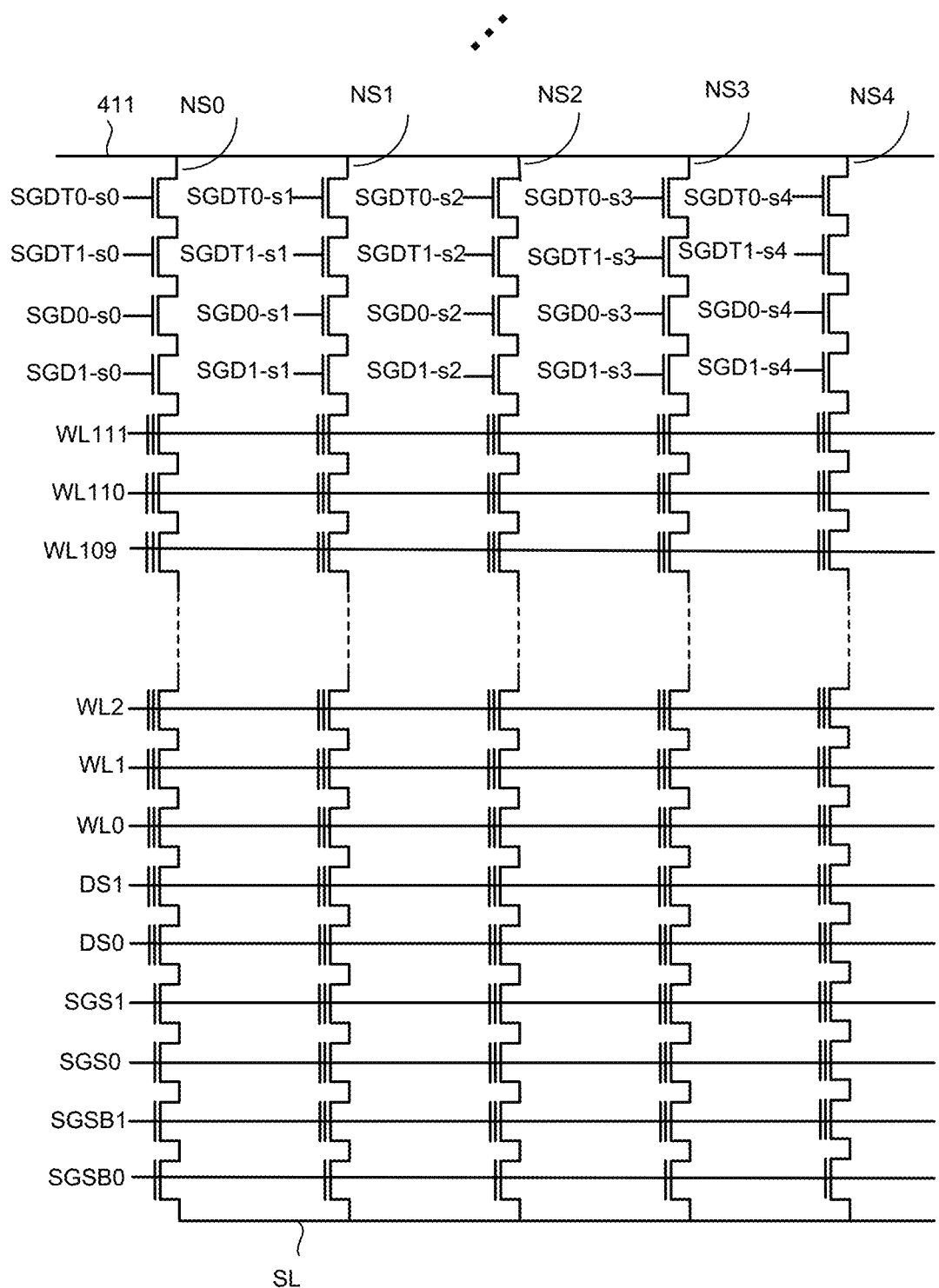
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1. SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. The set of drain side select lines connected to NS4 include SGDT0-*s*4, SGDT1-*s*4, SGD0-*s*4, and SGD1-*s*4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. A fifth sub-block corresponds to those vertical NAND strings controlled by SGDT0-*s*4, SGDT1-*s*4, SGD0-*s*4, and SGD1-*s*4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a block is operated as an upper tier and a lower tier, wherein the upper tier and the lower tier each form an erase unit. For example, memory cells connected to WL0-WL61 may be in the lower tier and memory cells connected to WL62-WL111 may be in the upper tier. Hence, memory cells connected to WL0-WL61 may be in one erase unit and memory cells connected to WL62-WL111 may be in another erase unit. A block could be operated in more than two tiers. Erase units can be formed based on other divisions of blocks.

Although the example memories of FIGS. 4-4E are three dimensional memory structure that includes vertical NAND strings with charge-trapping material, other 3D memory structures can also be used with the technology described herein.

The storage systems discussed above can be erased, programmed and read. At the end of a successful programming process, the Vts of the memory cells should be within one or more distributions of Vts for programmed memory cells or within a distribution of Vts for erased memory cells, as appropriate. Memory cells that store one bit of data per memory cell data are referred to as single level cells ("SLC"). The data stored in SLC memory cells is referred to as SLC data; therefore, SLC data comprises one bit per memory cell. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5A, each memory cell stores three bits of data. Other embodiments may use other data capacities per memory cell (e.g., such as two, four, or five bits of data per memory cell).

FIG. 5A shows eight Vt distributions, corresponding to eight data states. The first Vt distribution (data state) Er represents memory cells that are erased. The other seven Vt distributions (data states) A-G represent memory cells that are programmed and, therefore, are also called programmed states. Each Vt distribution (data state) corresponds to predetermined values for the set of data bits. The specific relationship between the data programmed into the memory cell and the Vt levels of the cell depends upon the data encoding scheme adopted for the cells. In one embodiment, data values are assigned to the Vt ranges using a Gray code assignment so that if the Vt of a memory erroneously shifts to its neighboring physical state, only one bit will be affected. In an embodiment, the number of memory cells in each state is about the same.

FIG. 5A shows seven read reference voltages, VrA, VrB, VIC, VrD, VrE, VrF, and VrG for reading data from memory cells. By testing (e.g., performing sense operations) whether the Vt of a given memory cell is above or below the seven read reference voltages, the system can determine what data state (i.e., A, B, C, D, . . . ) a memory cell is in. FIG. 5A also shows a number of verify reference voltages. The verify reference voltages are VvA, VvB, VvC, VvD, VvE, VvF, and VvG. In some embodiments, when programming memory cells to data state A, the system will test whether those memory cells have a Vt greater than or equal to VvA. If the memory cell has a Vt greater than or equal to VvA, then the memory cell is locked out from further programming. Similar reasoning applies to the other data states.

In embodiments, the LT verify with UT verify circuitry 131 may be used to perform an UT verify of one data state simultaneously with a LT verify of another data state. The LT verify may verify at the verify reference voltages: VvA, VvB, VvC, VvD, VVE, VVF, and VvG. The UT verify may verify at, for example, Vev, VoA, VoB, VoC, VOD, VoE, VoF. In some cases the UT verify is for the data state immediately below (in Vt) the data state for the LT verify.

FIG. 5B depicts a threshold voltage (Vt) distributions when each memory cells stores four bits. There are sixteen data states (S0-S15). Memory cells are programmed from an erased state to one of 15 programmed states (S1-S15). There are 15 program verify voltages (Vv1-Vv15), with each program verify voltage used to verify one of the programmed states. For example, memory cells to be programmed to S1 have their Vt compared to Vv1, memory cells to be programmed to S2 have their Vt compared to Vv2, etc.

In embodiments, the LT verify with UT verify circuitry 131 may be used to perform an UT verify of one data state simultaneously with a LT verify of another data state. The LT verify may verify at the verify reference voltages: Vv1-Vv15. The UT verify may verify at, for example, Vo0-V014. In some cases the UT verify is for the data state immediately below (in Vt) the data state for the LT verify. However, the UT verify is not required to be the data state immediately below (in Vt) the data state for the LT verify.

Figure 6:
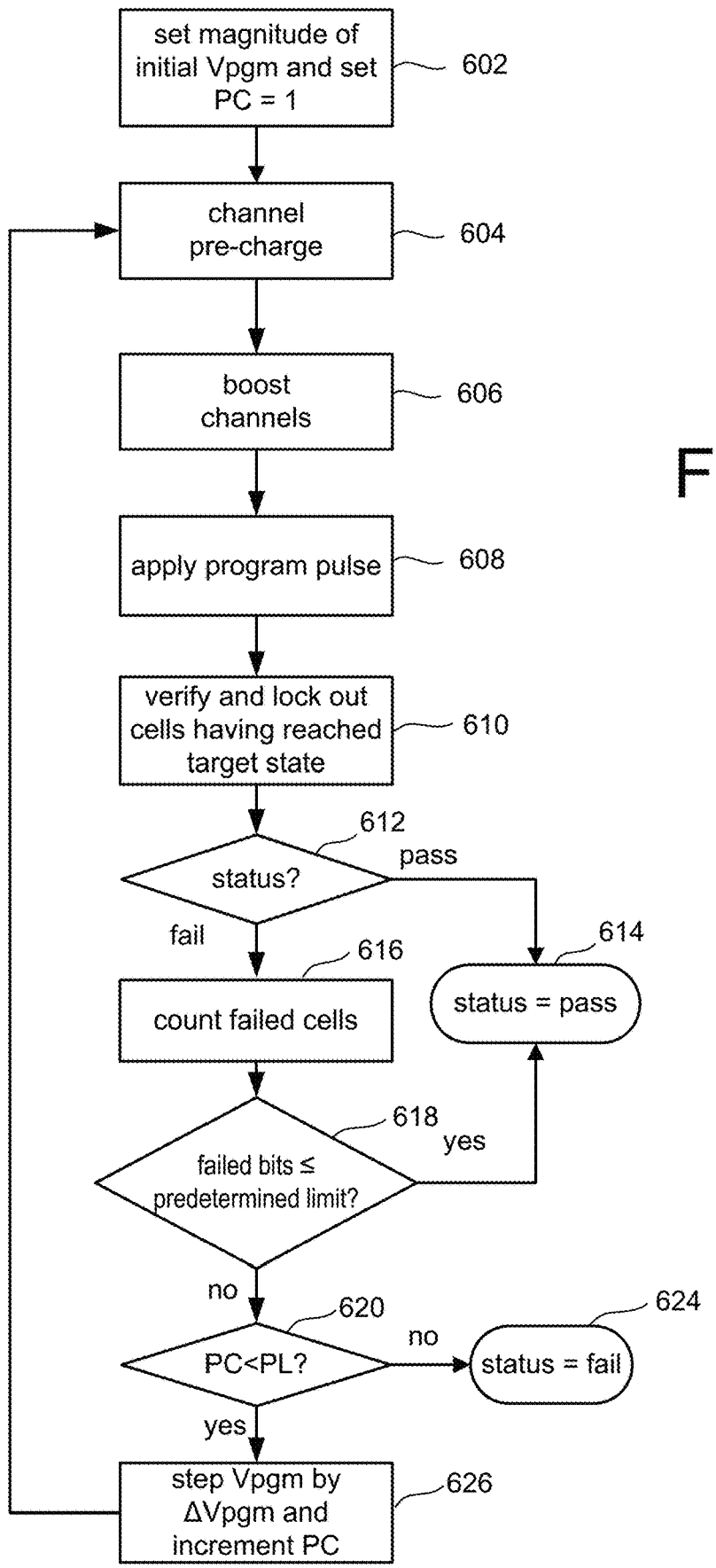
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their Vt change, unless they are inhibited from programming.

In step 610, program verify is performed and memory cells that have reached their target states are locked out from further programming. Step 610 includes performing verification of programming by sensing at one or more verify reference levels. In one embodiment, the verification process is performed by testing whether the Vts of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 or R/W circuits 225 are used to indicate whether a memory cell is locked out or is to receive full programming. In an embodiment, the system performs a simultaneous LT verify of one data state with an UT verify of another data state.

If, in step 612, it is determined that all of the memory cells have reached their target Vts (pass), the programming process is complete and successful because all selected memory cells were programmed and verified to their target states. A status of "PASS" is reported in step 614. Otherwise if, in step 612, it is determined that not all of the memory cells have reached their target Vts (fail), then the programming process continues to step 616.

In step 616, the number of memory cells that have not yet reached their respective target Vt distribution are counted. That is, the number of memory cells that have, so far, failed to reach their target state are counted. In an embodiment, a separate fail bit count may be kept for each data state. Note that, in some embodiments, program verify of the higher Vt data states does not begin until later program loops, in which case step 618 could be skipped until verify of all data states has been initiated. In one embodiment, the test in step 618 is for a total fail bit count for all data states. In one embodiment, the test in step 618 is for each data state to pass based on a fail bit count for that data state. In one embodiment, the fail bit count (or counts) also includes memory cells that failed an UT verify. If the memory cells that failed an UT verify are included in a fail bit count then a suitable adjustment may be made to the number of cells that are allowed to fail in the count.

In step 618, it is determined whether the count from step 616 is less than or equal to a predetermined limit. In one embodiment, the predetermined limit is based on the number of bits that can be corrected by error correction codes (ECC) during a read process for the page of memory cells. In an embodiment, the allowed number of failed bits may be a pro rata portion of the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, comparing a count for only one data state (or less than all states), or sampling only some of the memory cells, then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size $\Delta$Vpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7:
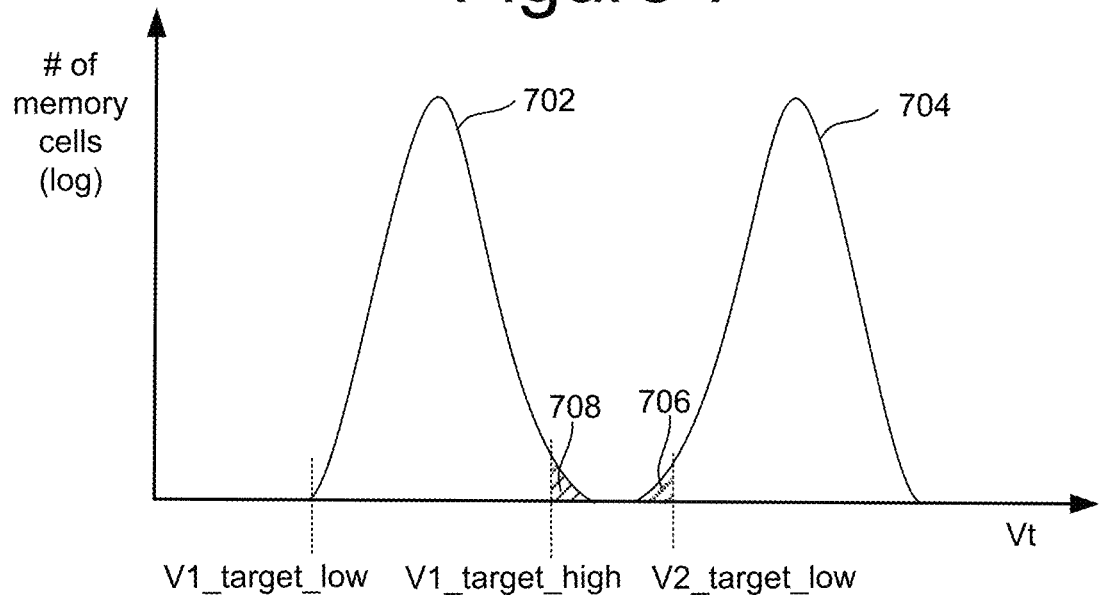
FIG. 7 depicts two Vt distributions to illustrate testing memory cells targeted to different data states.

An embodiment of a memory system simultaneously performs a lower tail verify of one data state with an upper tail verify of another data state. In one embodiment, the memory system program verifies memory cells targeted to one data state while testing for over-programming of memory cells targeted for another data state. FIG. 7 depicts two Vt distributions to illustrate testing memory cells targeted to different data states. Threshold distribution 702 represents the Vts of memory cells targeted to a first data state. Moreover, threshold distribution 702 is for a time when all, or at least most, of the memory cells targeted to the first data state have a Vt at least as high as the minimum target Vt for the first data state (V1_target_low). Threshold distribution 704 represents memory cells targeted to a second data state. The reference voltage V2_target_low is a verify reference voltage for the lower tail of the second data state. Memory cells in region 706 of threshold distribution 704 have not yet reached the minimum target Vt for the second data state. Therefore, threshold distribution 704 is an example in which most, but not all, of the memory cells targeted to the second data state have a Vt at least as high as the target Vt for the second data state (V2_target_low). The target verify reference voltage for a data state may be referred to herein as a minimum target Vt. FIG. 7 also depicts a maximum target Vt for the first data state (V1_target_high). Note that some of the memory cells targeted for the first data state have a Vt above the maximum target Vt for the first data state. Memory cells in region 708 of threshold distribution 702 have a Vt above the maximum target Vt for the first data state. Such memory cells with a Vt above V1_target_high may, in some cases, be referred to as over-programmed memory cells. An embodiment of a memory system simultaneously verifies whether memory cells to be programmed to the second data state have a Vt of at least the minimum target Vt (e.g., V2_target_low) while determining whether memory cells targeted for the first data state have a Vt of over the maximum target Vt for the first data state (e.g., V1_target_high). In an embodiment, the memory system simultaneously tests for over-programming of cells targeted for the first data state while program verifying cells targeted for the second data state. Simultaneously testing for over-programming of cells targeted for the first data state while program verifying cells targeted for the second data state reduces programming time relative to a technique that separately tests for over-programming of cells. In an embodiment, the memory system simultaneously tests for erased state cells having a Vt higher than a maximum target Vt while program verifying cells targeted for a programmed data state.

Figure 8:
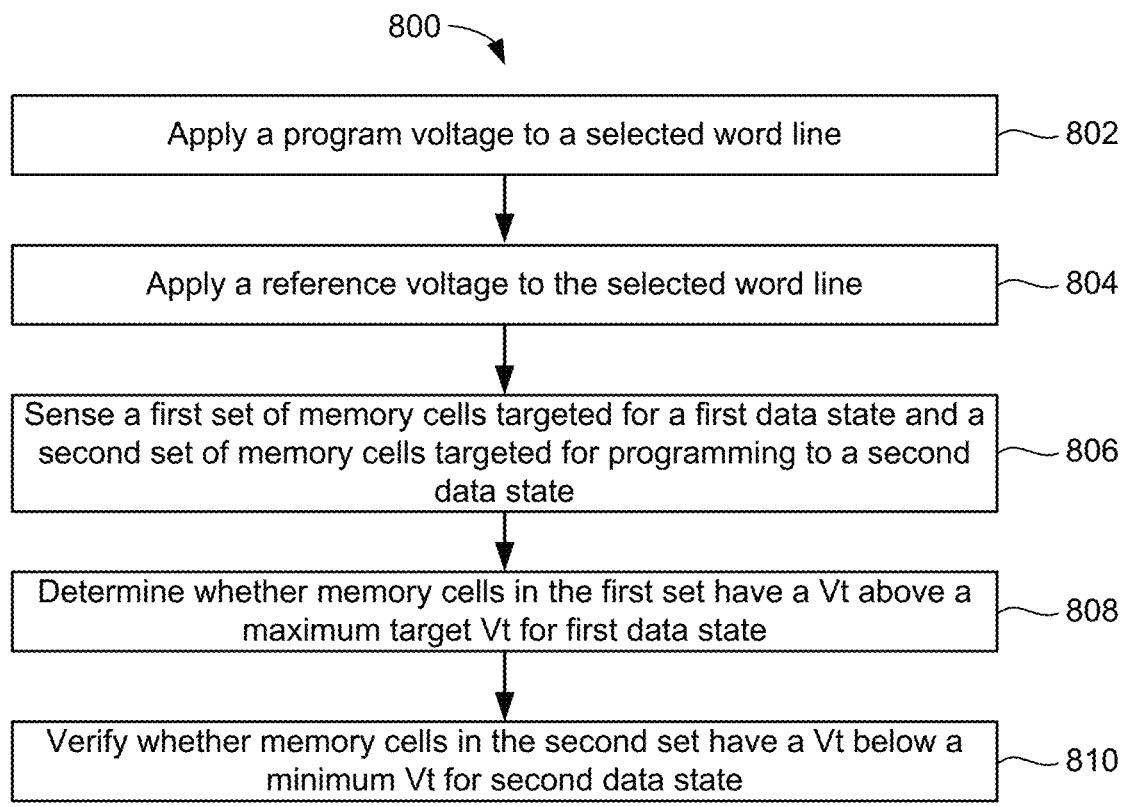
FIG. 8 is a flowchart of one embodiment of a process for simultaneous testing for over-programming of one data state while program verifying another data state.

FIG. 8 is a flowchart of one embodiment of process 800 for simultaneous UT verify of one data state with LT verify of another data state. In an embodiment, process 800 tests for over-programming of one data state while program verifying another data state. In an embodiment, process 800 tests for erased state cells having a Vt higher than a maximum target Vt while program verifying cells targeted for a programmed data state. The process 800 occurs during one program/verify loop of a programming process that may have a number of program/verify loops. In one embodiment, process 800 is performed by one or more control circuits on the memory die 200. In one embodiment, process 800 is performed by one or more control circuits on the control die 211.

Step 802 includes applying a program voltage to a selected word line. The selected word line is connected to a group of memory cells on a set of NAND strings. The group of memory cells include a first set of memory cells targeted for a first data state and a second set of memory cells targeted for programming to a second data state. The group of memory cells may contain other sets of memory cells as well.

Step 804 includes applying a reference voltage to the selected word line. Referring to FIG. 7, the reference voltage could be V2_target_low, which is an example of a verify reference voltage. In an embodiment, the reference voltage is a verify reference voltage such as one of Vva, VvB, VvC, VvD, VvE, VvF, or VvG depicted in FIG. 5A. Another example of verify reference voltages are Vv1-Vv15 depicted in FIG. 5B. However, the reference voltage in step 804 is not required to be a verify reference voltage. In one embodiment, the reference voltage could be V1_target_high, which is an example maximum target Vt for a data state. In an embodiment, the reference voltage is an UT verify reference voltage such as one of Voa, VoB, VoC, VOD, VoE, VoF, or VoG depicted in FIG. 5A. Another example of UT verify reference voltages are Vo1-Vo15 depicted in FIG. 5B. Step 802 may also include applying sensing voltages to bit lines.

Step 806 includes sensing the first set of memory cells and the second set of memory cells. The sensing is performed in response to application of the reference voltage to the selected word line.

Step 808 includes determining whether memory cells in the first set of memory cells have a Vt greater than a maximum target Vt for the first data state. In an embodiment, step 808 tests for over-programming of memory cells in the first set. In an embodiment, step 808 tests for erase state cells in the first set having a Vt above a maximum target Vt for the erase state.

Step 810 includes determining whether memory cells in the second set of memory cells have a Vt less than a minimum target Vt for the second data state. Thus, step 810 may be used to program verify cells in the second set. In an embodiment, steps 808 and 810 are performed simultaneously.

In some embodiments, a determination is made as to whether programming has failed based on the results of step 808 and/or step 810. In one embodiment if too many memory cells have a Vt above the maximum target Vt for the first data state then a status of program fail will be returned to the memory controller 120. In one embodiment if too many memory cells have a Vt below the minimum target Vt for the second data state after a certain number of program loops then a status of program fail will be returned to the memory controller 120. In one embodiment, the program fail status will be based on a total count of memory cells having a Vt above the maximum target Vt for the first data state and memory cells having a Vt below the minimum target Vt for the second data state after a certain number of program loops. The number memory cells allowed to fail for the total count method may be be larger than number memory cells allowed to fail if the count is based on only results from step 808 or step 810.

FIG. 9 is a flowchart of one embodiment of a process 900 for counting fail bits during UT verify of one data state with LT verify of another data state. Herein a fail bit for an UT verify of a data state refers to a cell that has a Vt above the maximum target Vt for that data state. Herein a fail bit for a LT verify of a data state refers to a cell that has a Vt below the minimum target Vt for that data state. Process 900 may count over-programmed memory cells for one data state and under-programmed memory cells of another data state based on applying the same reference voltage to a selected word line. The term "under-programmed memory cells" is used herein to refer to a cell that has a Vt below the minimum target Vt for that data state. An under-programmed cell may be corrected in many cases by applying one or more additional program voltages. However, there is a limit to how many program voltages will be applied. The process 900 provides further details of one embodiment of the verify portion (steps 804-810) of process 800. In one embodiment, process 900 is performed by one or more control circuits on the memory die 200. In one embodiment, process 900 is performed by one or more control circuits on the control die 211.

Step 902 includes applying a first voltage to first bit lines connected to first NAND strings having a first set of memory cells targeting for a first data state. Step 904 includes applying a second voltage to second bit lines connected to second NAND strings having a second set of memory cells targeting for a second data state. Steps 902 and 904 are performed together. Steps 902 and 904 may be initiated during a bit line pre-charge phase of a program verify operation.

Step 906 includes applying a reference voltage to the selected word line. Step 906 may be similar to step 804 in process 800. The bit line voltages continue to be applied while the reference voltage is applied to the selected word line. In an embodiment, the voltage applied to the first bit lines has a different magnitude than the voltage applied to the second bit lines in order to result in a first effective reference voltage for the first memory cells and a second effective reference voltage for the second memory cells.

Step 908 includes sensing the first set of memory cells and the second set of memory cells. Step 908 may be performed while the reference voltage continues to be applied the selected word line and the sensing voltages continue to be applied to the first bit lines and to the second bit lines. Note that there could be some bit lines that are not involved in the sensing operation. For example, bit lines connected to memory cells targeted for other than the first data state or second data state are not sensed in an embodiment of step 908.

Step 910 includes counting memory cells in the first set that have a Vt above the maximum target Vt for the first data state. For example, step 910 may include counting memory cells in region 708 of Vt distribution 702 in FIG. 7. In one embodiment, step 910 counts over-programmed memory cells. In one embodiment, step 910 counts erase state memory cells having a Vt above the maximum target Vt for the erase state.

Step 912 includes counting memory cells in the second set that have not yet reached the minimum target Vt for second data state. Such cells could be referred to as being under-programmed. For example, step 912 may include counting memory cells in region 706 of Vt distribution 704 in FIG. 7.

In one embodiment, a single count is made that includes a total of the over-programmed cells in the first set and the under-programmed cells in the second set. In one embodiment, a first count is made that includes only the over-programmed cells in the first set and a second count is made that includes only the under-programmed cells in the second set.

Step 914 includes a determination of whether programming has failed. This test is based on the count of step 910 and may optionally be based on the count from step 912. If there is a separate count of cells from step 910 then programming may fail regardless of the separate count from step 912. In some cases if the count from step 912 is too high then additional programming may be applied to memory cells that have not yet reached the minimum target Vt for the second data state. If the determination is that programming failed, then a report of program fail is made in step 916 to the memory controller 120. If the determination is that programming has not failed, then a determination is made in step 918 whether programming is done. This may be based on the count from step 912; however, the system will also consider whether other data states have completed programming. If programing is done, then in step 920 a report of program pass is made to the memory controller 120. If programing is not yet done, then programming continues in step 922.

Figure 10A:
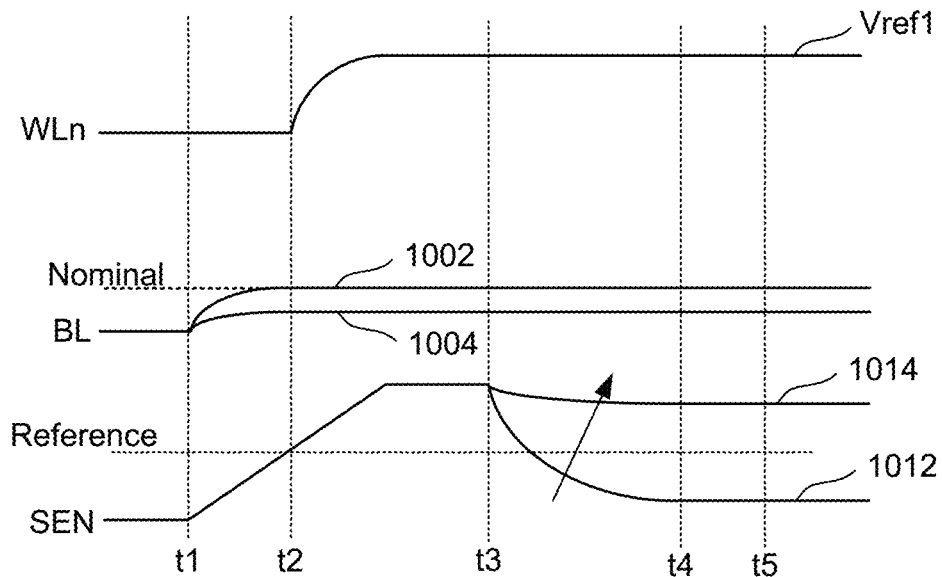
FIG. 10A depicts a timing diagram of signals in one embodiment of sensing a first set of memory cells and a second set of memory cells.

FIG. 10A depicts a timing diagram of signals in one embodiment of sensing the first set of memory cells and the second set of memory cells during simultaneous LT verify of one data state with UT verify of another data state. FIG. 10A depicts timing of the voltage on the selected word line (WLn), timing of the voltage on the first bit lines associated with the first set of memory cells (plot 1004), and timing of the voltage on the second bit lines associated with the second set of memory cells (plot 1002). Also depicted is a plot for voltage on a sensing node (SEN) in the sense amplifier. There is typically a sense node for each bit line.

At t1 the bit line (BL) voltages are increased to their respective sensing levels. In an embodiment, the voltage for the first set of bit lines is lower than the voltage on the second set of bit lines. In FIG. 10A, the voltage for the second set of bit lines is referred to as a nominal voltage. The time between t1 and t2 may be referred to as a bit line pre-charge phase.

At t1 the voltage on SEN begins to change towards a sensing voltage. At t2 the voltage on the selected word line begins to ramp towards the reference voltage (Vref1). At t3 the sense node is connected to one of the bit lines. The sense node remains connected to the bit line between t3 and t4, which may be referred to as a sense time or integration time. During the sense time the sense node may be discharged by the current in the bit line. Two plots 1012 and 1014 are depicted for the discharge of SEN. Plot 1012 is for a case in which the memory cell conducts a significant current (which flows in the bit line), such that the voltage on SEN falls below a reference voltage (reference). Plot 1014 is for a case in which the memory cell does not conduct a significant current, such that the voltage on SEN remains above the reference voltage. The term "significant current" in the context of sensing memory cells may be defined relative to the reference voltage to which the voltage on SEN is compared. That is, a memory cell current that discharges SEN to below the reference voltage is deemed a "significant current". A memory cell current that fails to discharge SEN to below the reference voltage is deemed to not be a "significant current".

Figure 10B:
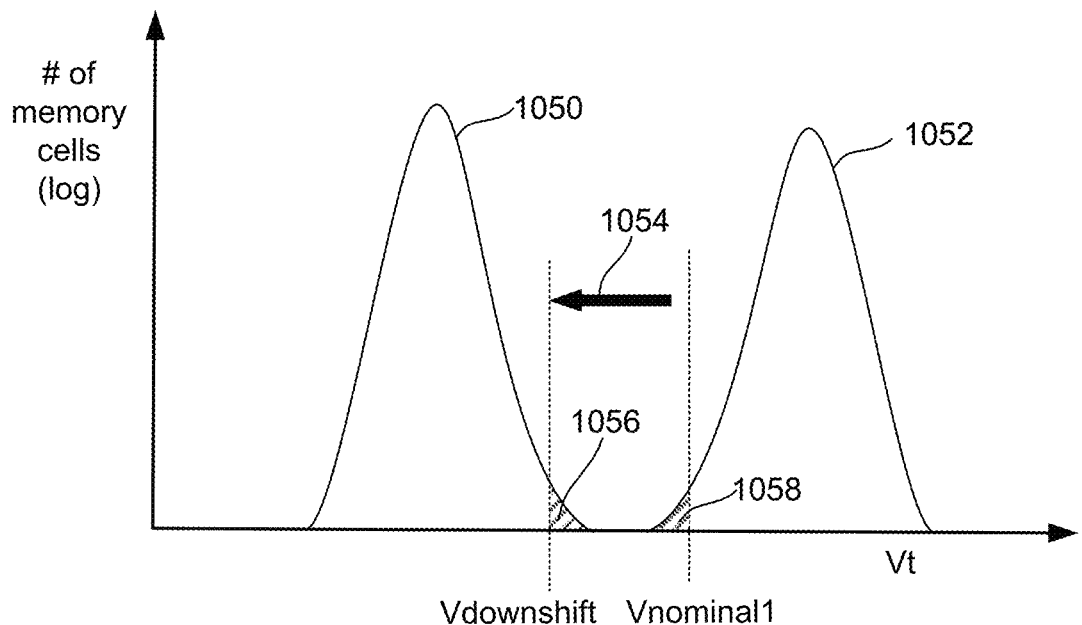
FIG. 10B will be referred to in order to further elaborate on two effective reference voltages during sensing of memory cells.

In an embodiment, the bit line voltage of plot 1004 shifts down the effect of the reference voltage on the memory cell. Therefore, the first bit line voltage 1002 results in a first effective reference voltage and the second bit line voltage 1004 results in a second effective reference voltage (less than the first effective reference voltage). FIG. 10B will be referred to in order to further elaborate on the two effective reference voltages. FIG. 10B depicts a Vt distribution 1050 for the first set of memory cells that are targeted for the first data state and a Vt distribution 1052 for the second set of memory cells that are targeted for the second data state. A first effective reference voltage (Vnominal1) and a second effective reference voltage (Vdownshift) are depicted. In an embodiment, the first effective reference voltage (Vnominal1) results from applying Vref1 to the selected word line with the nominal sensing voltage 1002 to the bit line. In an embodiment, the second effective reference voltage (Vdownshift) results from applying Vref1 to the selected word line with the below nominal sensing voltage 1004 to the bit line. Thus, the effect of using the less than nominal sensing voltage for the bit line voltage is to downshift the effective reference voltage (see arrow 1054 in FIG. 10B). In an embodiment, Vnominal1 may be used to program verify the memory cells targeted for the second data state (e.g., test for cells in region 1058 of Vt distribution 1052) and Vdownshift may be used to test for over-programmed memory cells (e.g., test for cells in region 1056 of Vt distribution 1050).

Note that if a memory cell in region 1056 were to have the effective Vnominal1 applied it would conduct a significant current, which would correspond to plot 1012 in FIG. 10A. However, if a memory cell in region 1056 were to have the effective Vdownshift applied it would not conduct a significant current, which would correspond to plot 1014 in FIG. 10A.

Figure 11A:
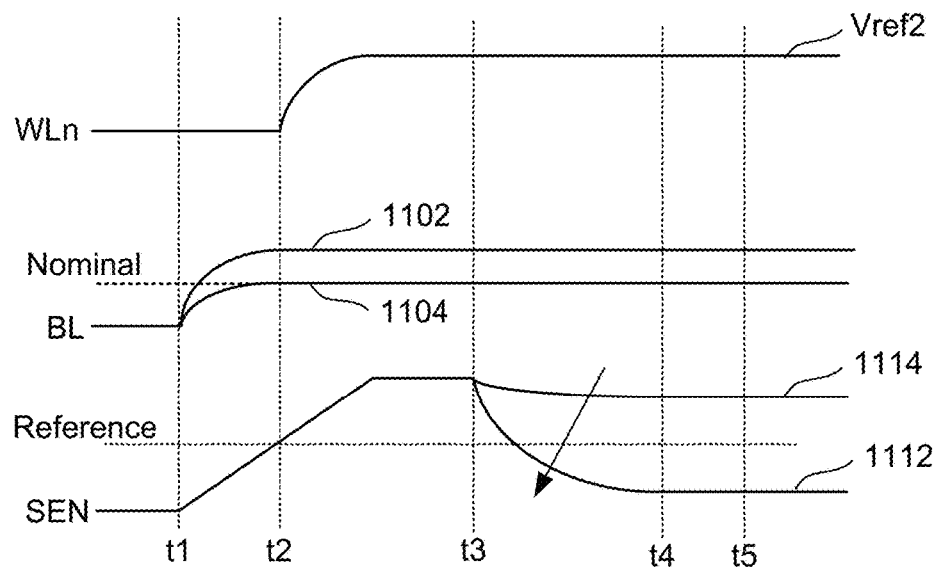
FIG. 11A depicts a timing diagram of signals in one embodiment of sensing the first set of memory cells and the second set of memory cells that has an alternative BL voltage scheme than FIG. 10A.

FIG. 11A depicts a timing diagram of signals in one embodiment of sensing the first set of memory cells and the second set of memory cells that has a different BL voltage scheme than FIG. 10A. FIG. 11A depicts timing of the voltage on the selected word line (WLn), timing of the sensing voltage on the first bit lines associated with the first set of memory cells (plot 1004), and timing of the sensing voltage on the second bit lines associated with the second set of memory cells (plot 1002). Note that the scheme in FIG. 11A applies the nominal sensing voltage to the first bit lines and a higher than nominal sensing voltage to the second bit lines. Also depicted is a plot for voltage on a sensing mode (SEN). There is typically a sense node for each bit line.

At t1 the bit line (BL) voltages are increased to their respective sensing voltages. In an embodiment, the voltage for the first set of bit lines is lower than the voltage on the second set of bit lines. However, in FIG. 11A, the voltage 1104 for the first set of bit lines is referred to as the nominal sensing voltage and the voltage 1102 for the second set of bit lines is a higher than nominal sensing voltage (which contrasts with the bit line voltages in FIG. 10A).

At t1 the voltage on SEN begins to change towards a sensing voltage. At t2 the voltage on the selected word line begins to ramp towards the reference voltage (Vref2). Note that Vref2 may have a different magnitude than Vref1. In an embodiment, Vref2 has a lower magnitude than Vref1 (in FIG. 10A). At t3 the sense node is connected to one of the bit lines. The sense node remains connected to the bit line between t3 and t4. During the sense time the sense node may be discharged by the current in the bit line. Two plots 1112 and 1114 are depicted for the discharge of SEN. Plot 1112 is for a case in which the memory cell conducts a significant current (which flows in the bit line), such that the voltage on SEN falls below a reference voltage (reference). Plot 1114 is for a case in which the memory cell does not conduct a significant current, such that the voltage on SEN remains above the reference voltage.

Figure 11B:
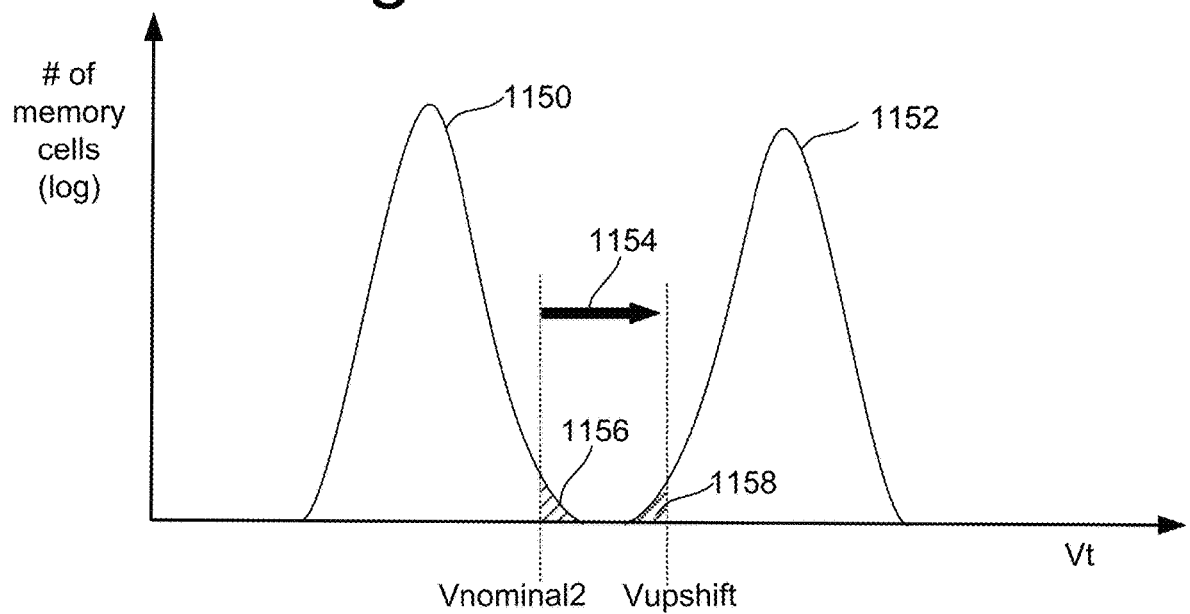
FIG. 11B will be referred to in order to further elaborate on the two effective reference voltages.

In an embodiment, the bit line voltage of plot 1102 shifts up the effect of the reference voltage on the memory cell. Therefore, the first bit line voltage 1102 results in a first effective reference voltage and the second bit line voltage 1104 results in a second effective reference voltage (less than the first effective reference voltage). FIG. 11B will be referred to in order to further elaborate on the two effective reference voltages. FIG. 11B depicts a Vt distribution 1150 for the first set of memory cells that are targeted for the first data state and a Vt distribution 1152 for the second set of memory cells that are targeted for the second data state. A first effective reference voltage (Vnominal2) and a second effective reference voltage (Vupshift) are depicted. In an embodiment, the first effective reference voltage (Vnominal2) results from applying Vref2 to the selected word line with the nominal voltage 1104 to the bit line. In an embodiment, the second effective reference voltage (Vupshift) results from applying Vref2 to the selected word line with the above nominal voltage 1104 to the bit line. Thus, the effect of using the greater than nominal sensing voltage to the bit line voltage is to upshift the effective reference voltage (see arrow 1154 in FIG. 11B). In an embodiment, Vnominal2 may be used to test for over-programmed memory cells (e.g., test for cells in region 1156 of Vt distribution 1150) and Vupshift may be used to program verify the memory cells targeted for the second data state (e.g., test for cells in region 1158 of Vt distribution 1152). Note that if a memory cell in region 1156 were to have the effective Vnominal2 applied it would not conduct a significant current, which would correspond to plot 1114 in FIG. 11A. However, if a memory cell in region 1156 were to have the effective Vupshift applied it would conduct a significant current, which would correspond to plot 1112 in FIG. 11A.

FIG. 12 is a flowchart of one embodiment of a process 1200 of programming memory cells that includes a simultaneous UT verify of one data state with LT verify of another data state. The process may be used for program verify with over-program detection. The process may be used for program verify with detection of erase state cells having a Vt above a maximum target Vt for the erase state. Process 1200 includes a portion of a programming process that includes applying two program voltages. The overall programming process will typically include more than two program voltages. In one embodiment, process 1200 is performed by one or more control circuits on the memory die 200. In one embodiment, process 1200 is performed by one or more control circuits on the control die 211.

Step 1202 includes applying a program voltage to a selected word line. The selected word line is connected to a group of memory cells on a set of the NAND strings. The group of memory cells includes a first set of memory cells targeted for programming to a first data state and a second set of memory cells targeted for programming to a second data state. The group of memory cells may have other sets that are targeted for programming to other data states. Note that the group will have been erased prior to programming with one set of the memory cells to remain in the erase state after programming of the other sets is complete.

Step 1204 includes verifying whether memory cells in the first set are programmed to the first data state (e.g., LT verify). This step is not required to have a simultaneous UT verify of a different data state (e.g., over-program test), although that is an option. The program verify may test whether cells in the first set have a Vt of at least a minimum target Vt for the first data state. Examples of the minimum target Vt of a data state are the LT verify reference voltages in FIGS. 5A (e.g., VvA-VvG) and 5B (e.g., Vv1-Vv15). Optionally, the memory cells in the second set could be program verified in the verify phase following the program voltage of step 1202. However, in some embodiments, not all data states are verified each program/verify loop.

Step 1206 includes storing a program inhibit indicator for memory cells in the first set that are program verified for the first data state. The program inhibit indicator is used to track which cells should be inhibited from programming in the program phase of further program loops. A related concept is a "lockout indicator", which indicates which cells should be locked out from sensing during the program verify phase. In some embodiments, the lockout indicator may be separate from the program inhibit indicator. A number of techniques may be used to store the program inhibit indicator. In one embodiment, the program inhibit indicator is stored in the data latches that contain programming data. For example, with reference to FIG. 3C the ADL, BDL, CDL, and DDL latches can be used to store a code that indicates which of the 16 data states a cell is targeted for. In a three bit per cell example, the DDL latches are not used, such that the ADL, BDL and CDL latches may be used to indicate which of the eight data states a cell is targeted for. One technique to store the program inhibit indicator includes setting the data latches to the code for the erased state. For example, the code for the erase state could be a "1" in each data latch. Since memory cells targeted to remain in the erased state are to be inhibited from programming throughout the programming process, setting the data latches to the erased state code will result in inhibiting that cell from any further programming in later programming loops. The technique to store the lockout indicator may include setting another latch that may be used, for example, to indicate a voltage to apply to the bit line. For example, a bit line connected to memory cell to receive programming may have 0V applied during programming, whereas a bit line connected to a memory cell to be inhibited from programming may have about 2.5V applied during programming. However, in some techniques a memory cell that is inhibited from programming will not be sensed during a program verify phase. For example, a memory cell may be "locked out" from sensing during the verify phase by applying a "lockout voltage" (e.g., 0V) to the bit line, whereas a memory cell may be sensed during the verify phase by applying a "sensing voltage" (e.g., a voltage greater than 0V) to the bit line. In some embodiments, there is a latch that indicates the "sensing lockout" status. Therefore, inhibiting a cell from further programming could also cause the circuitry to default to not sensing that memory cell during the verify phase in later program loops.

Step 1208 includes applying a program voltage to the selected word line while inhibiting from programming any memory cells in the first set that have been program verified as being at the first data state. Memory cells targeted for other data states that have reached their respective data states may also be inhibiting from programming.

Step 1210 includes over-riding the stored lockout indicator of the first memory cells to enable an over-programming test for the first set of memory cells. A number of techniques could be used to over-riding the stored lockout indicator. In one embodiment, the over-riding of the stored lockout indicator may be achieved without the need for any additional data latches. In one embodiment, step 1210 includes examining latches that contains the "inhibit" status to locate cells that should be sensed during this over-programming test in the verify phase. Note that the sensing may be used for over-program detection. In one embodiment, there is a latch that indicates whether to include a memory cell in the count of step 1212 described below. In one embodiment, the latch for the cells in the first set that were locked out will have a value to indicate that the cell is not to be included in a "fail bit count". In one embodiment, step 1210 includes resetting such a latch to a value to indicate that the cell is to be included in the "fail bit count" of step 1212. In one embodiment, step 1210 includes setting the SDL latch (see SDL 329 in FIG. 3C) to a value that indicates that the associated cell is not locked out from sensing.

Step 1212 includes simultaneously verifying whether memory cells in the second set are programmed to the second data state while determining whether memory cells in the first set are over-programmed. Step 1212 may include applying a single reference voltage to the selected word line with different voltages to the bit lines connected to the first and second sets of cells as has been previously described. Step 1212 may include counting cells in the first set that have a Vt above a maximum target Vt for the first data state and cells in the second set that have a Vt below a minimum target Vt for the second data state. In some embodiments, a single count is made for both states. In some embodiments, a separate count is made for each state. Note that an alternative of step 1212 is to simultaneously verify whether memory cells in the second set are programmed to the second data state while determining whether erase state memory cells in the first set have a Vt above a maximum target Vt for the erase state.

Figure 13A:
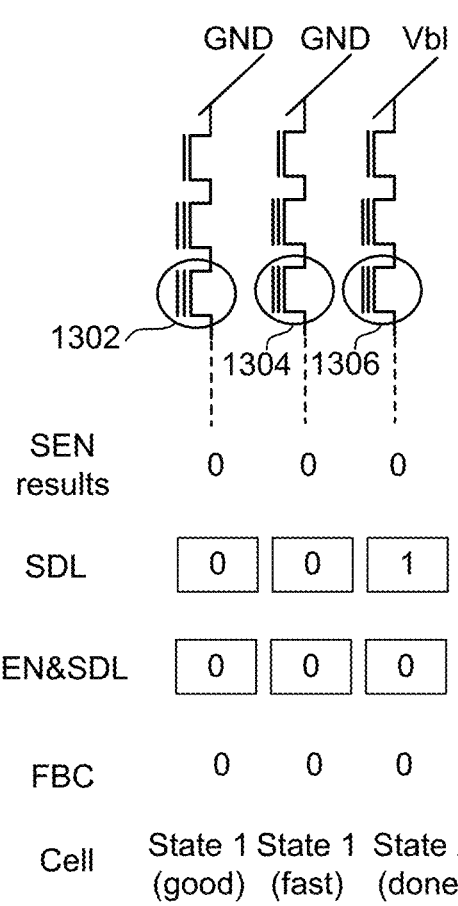
FIG. 13A shows details of latch operation and bit line biasing when verifying the second data state without over-program detection of the first data state.

FIG. 13A shows details of latch operation and bit line biasing when verifying the second data state without over-program detection of the first data state. Three example memory cells will be discussed. One cell 1302 is targeted for the first data state and has its Vt below the maximum target Vt for the first data state. A second cell 1304 is also targeted for the first data state; however, its Vt is above the maximum target Vt for the first data state (e.g., it is over-programmed). A third cell 1306 is targeted for the second data state and has its Vt above the minimum Vt for the second data state. In this example, neither cell targeted for the first data state is to be sensed during the verify phase; therefore, their respective bit lines are set to a "lockout voltage" of, for example, 0V. The bit line of the cell targeted to the second data state is set to a "sensing voltage" of Vbl.

In one embodiment, the SDL latch 329 is used to indicate what memory cells should be verified at a given point in time. In one technique, a value of 1 in the SDL latch 329 means that the associated memory cell is to be verified (e.g., included in a fail bit count). In one technique the SDL latch 329 may be set based on the contents of the data latches (e.g., ADL, BDL, CDL). For example, if the A-state is to be verified, then cells having the code for the A-state in their respective data latches (e.g., ADL, BDL, CDL) may have their SDL latch 329 set to 1. In FIG. 13A, The SDL latch 329 is set to "0" for the cells targeted to the first data state, which indicates that those cells are not to be counted as part of a fail bit count (FBC) when verifying S2. However, the SDL latch 329 for the cell targeted for the second data state is set to "1", which indicates that this cell is to be counted as part of the fail bit count.

Because the bit lines of the cells targeted for the first data state have the lockout voltage, no sensing of those cells is performed. As a result the sensing result (SEN) is "0" regardless of the Vt of the memory cell. The sensing result (SEN) for the cell targeted to the second data state is "0", which indicate that the third cell's Vt is above the minimum target Vt for the second data state. If, however, the Vt of the third cell 1306 was below the minimum target Vt for the second data state, then SEN would be "1".

FIG. 13A also shows a result formed by SEN&SDL. For a cell being programming to the second data state to be counted as a fail bit, it should have SEN of 1 (along with SDL of 1). In the example of FIG. 13A, the cell 1306 being programming to the second data state cell has a Vt above the minimum target Vt for the second data state, which results in SEN being 0. Therefore, the third cell 1306 is not counted as a fail bit.

Figure 13B:
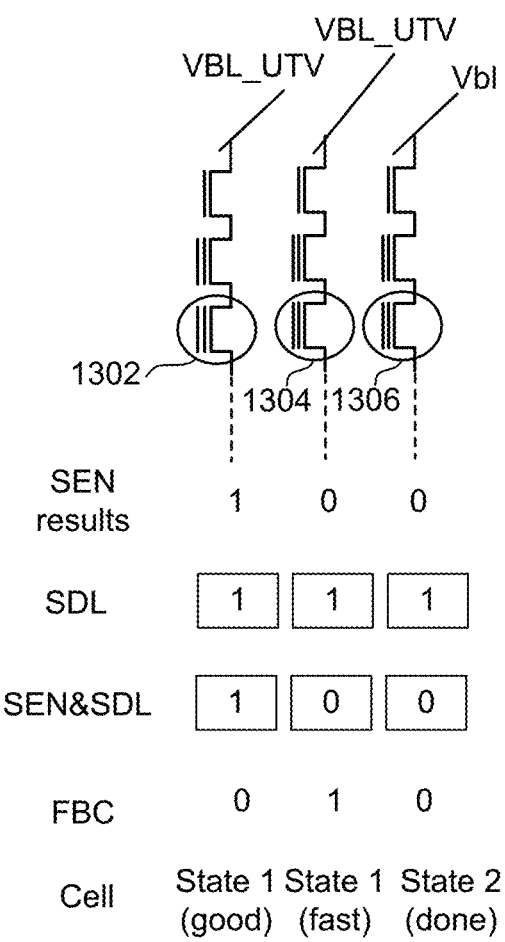
FIG. 13B shows details of latch operation and bit line biasing when verifying the second data state with over-program detection of the first data state.

FIG. 13B shows details of an embodiment of latch operation and bit line biasing when verifying the second data state with over-program detection of the first data state. FIG. 13B will refer to the three example memory cells 1302, 1304, 1306 discussed with respect to FIG. 13A. In this example, both cells 1302, 1304 targeted for the first data state are to be sensed during the verify phase; therefore, their respective bit lines are set to a "sensing voltage" of VBL_UTV. The bit line of cell 1306 targeted to the second data state is also set to a "sensing voltage" of VBL. As has been previously discussed, the magnitude of the bit line voltage is different for the upper tail verify than for the lower tail verify. However, both bit line voltages may be referred to as sensing voltages as they enable the sense amplifier to sense whether the memory cell conducts a significant current in response to the reference voltage applied to the selected word line.

In one embodiment, the SDL latches 329 of the cells being targeted to the first data state are each set to 1 to enable the upper tail verify. Note that in FIG. 13A, the SDL latches 329 of the cells being targeted to the first data state are each set to 0, as in that example those cells were not presently being verified. However, setting the SDL latches 329 of the cells being targeted to the first data state to 1 allows such cells to be counted in a FBC when verifying the cells targeted to the second data state. Setting the SDL latches 329 of cells targeted to the first data state to 1 is one example of step 1210 to over-ride the lockout indication (see process 1200).

Because the bit lines of the three example cells all have either Vbl or VBL_UTV applied to the bit line sensing of those cells all there example cells is performed. The sensing result (SEN) for the first cell 1302 having a Vt below the maximum target Vt of the first data state is 1. The sensing result (SEN) for the second cell 1304 having a Vt above the maximum target Vt of the first data state is 0. The sensing result (SEN) for the cell 1306 targeted to the second data state is "0", indicating its Vt is above the minimum target Vt for the second data state.

FIG. 13B shows a result of SEN&SDL. All three example cells have 1 in SDL so this result will be equal to SEN. Any cell targeted for the second data state will be counted as a fail bit if its Vt is below the minimum target Vt of the second data state. In the example in FIG. 13B, a value of 1 in SEN would result in a FBC of 1 for a second data state cell. In the specific example, the second data state cell 1306 has a 0 in SEN, which results in a FBC of 0. In contrast, the cells 1302, 1304 targeted for the first data state are counted as fail bits if their Vt is above the maximum target Vt of the first data state. In the example in FIG. 13B, a value of 1 in SEN results in a FBC of 0 for the first cell 1302 and a value of 0 in SEN results in a FBC of 1 for the second cell 1304. Therefore, the cell 1304 having its Vt above the maximum target Vt for the first data state is counted as a fail bit. In an embodiment, if this is the first verify pulse of the second state cells, the memory system distinguishes between the first data state cells and the second data state cells based on the data latches 340 used to store a code for data targeted for the memory cell. Recall that in an embodiment, the ADL, BDL, CDL (and DDL for four bit programming) data latches (see data latches 340 in FIG. 3C) initially contain a code for the data state and may be set to the erased state code when the cell passes program verify. Therefore, in an embodiment, if this is the first verify pulse of the second state cells, the memory system examines the data latches 340 to look for cells having the erase state code and includes such cells in the test for over-programming. However, the memory system could examine latch(es) other than the data latches 340. In an embodiment, if this is the first verify pulse of the second state cells, the memory system distinguishes between the first data state cells and the second data state cells based on a latch used to set the bit line voltage. Recall that the bits lines for first data state cells are set to VBL_UTV, whereas the bit lines for the second data state cells are set to Vbl. In an embodiment, this is based on the TDL latch (see TDL 327 in FIG. 3C). Hence, in an embodiment, the content of the latches used to control the bit line voltages may be used to distinguish between the first data state cells and the second data state cells. In one embodiment, an additional latch may be used to distinguish between second state cells and first state cells that have passed verify in a previous loop. Therefore, with an additional latch even if this is the second, third, (fourth, etc.) time that the second state cells are being program verified the memory system can distinguish between first state cells and second state cells that have previously passed program verify and thus have their data latches 340 set to the erase state code.

Figure 14:
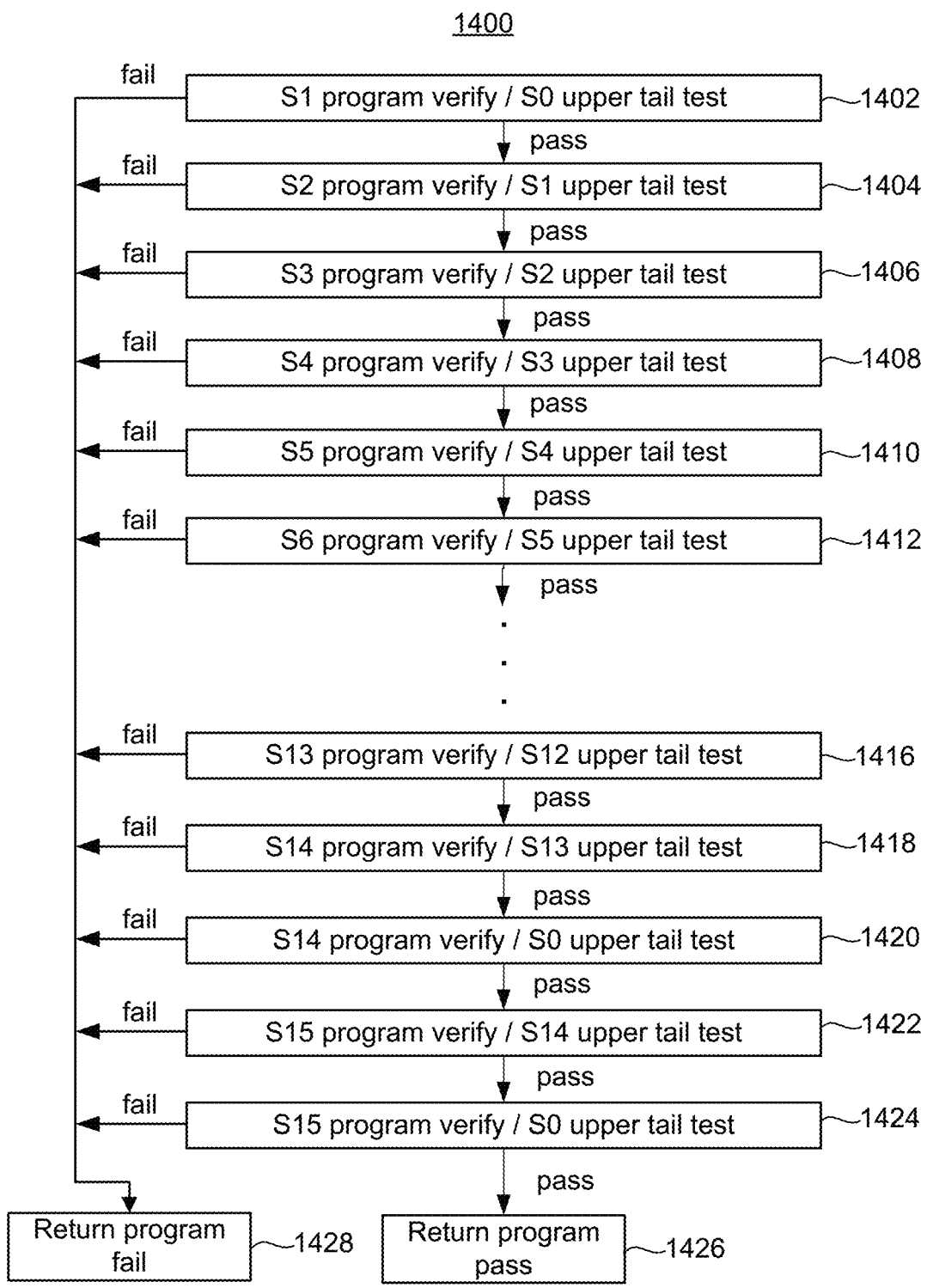
FIG. 14 is a flowchart of one embodiment of a process of simultaneous lower tail verify of one data state with upper tail verify of another data state.

FIG. 14 is a flowchart of one embodiment of a process 1400 of simultaneous lower tail verify of one data state with upper tail verify of another data state. Process 1400 corresponds to programming four-bits per cell. The steps of process 1400 happen during the verify phase, hence the applying of the program voltages are not depicted in process 1400. There could be other verify operations performed than are depicted in the steps of process 1400. The S0-S15 in FIG. 14 correspond to 16 data states as, for example, depicted in FIG. 5B. In one embodiment, process 1400 is performed by one or more control circuits on the memory die 200. In one embodiment, process 1400 is performed by one or more control circuits on the control die 211.

Step 1402 includes a simultaneous program verify of S1 with an S0 upper tail test. Note that the S0 upper tail test may be a test for erase-state to A-state fail bits. Based on one or more FBCs a determination is made whether the program process has failed. Note that for the process to fail based on the program verify of S1 the memory system will typically apply a number of program voltages to allow slower programming cells to reach S1. In one embodiment, a failure is reported in step 1428 if the total number of fail bits for the lower tail verify of S1 and the upper tail verify of S0 is above a threshold. In one embodiment, separate fail bit counts are made for the lower tail verify of S1 and the upper tail verify of S0. Hence, failure can be based on whether each individual FBC is greater than an allowed number for the respective upper tail verify and lower tail verifies.

Assuming that there is not a program failure, the memory system performs step 1404, which is a simultaneous program verify of S2 with an S1 upper tail test. In this case, the S1 upper tail test may be a test for over-programmed S1 cells. The counting and determination of program failure may be similar to step 1402. Step 1406 includes a simultaneous program verify of S3 with an S2 upper tail test. Step 1408 includes a simultaneous program verify of S4 with an S3 upper tail test. Step 1410 includes a simultaneous program verify of S5 with an S4 upper tail test. Step 1412 includes a simultaneous program verify of S6 with an S5 upper tail test. There may be simultaneous lower tail verifies with upper tail verifies between step 1412 and 1416. Step 1416 includes a simultaneous program verify of S13 with an S12 upper tail test. Step 1418 includes a simultaneous program verify of S14 with an S13 upper tail test. Step 1420 includes a simultaneous program verify of S14 with an S0 upper tail test. Note that step 1420 includes a test for Er-to-A-State fails. The Er-to-A-State fail could result due to programming of the data states. Moreover, the higher programming voltages typically used for the higher Vt states may be more likely to cause Er-to-A-State fail bits. Step 1422 includes a simultaneous program verify of S15 with an S14 upper tail test. Step 1424 includes a simultaneous program verify of S15 with an S0 upper tail test. Thus, step 1424 again test for Er-to-A-State fail bits. The process ends with a status of program pass in step 1426 if a program failure was not detected during process 1400. Note that process 1400 can be modified to handle programming to other the four bits per cell.

In view of the foregoing, a first embodiment includes an apparatus comprising one or more control circuits configured to connect to a three-dimensional memory structure having NAND strings, word lines, and bit lines. The word lines are connected to memory cells on the NAND strings. The bit lines are connected to the NAND strings. The one or more control circuits are configured to apply a program voltage to a selected word line connected to a group of memory cells on a set of the NAND strings. The group of memory cells includes a first set of memory cells targeted for a first data state and a second set of memory cells targeted for programming to a second data state. The one or more control circuits are configured to apply a reference voltage to the selected word line following applying the program voltage. The one or more control circuits are configured to sense the first set of memory cells and the second set of memory cells in response to applying the reference voltage to the selected word line. The one or more control circuits are configured to determine whether memory cells in the first set of memory cells have a threshold voltage greater than a maximum target threshold voltage for the first data state based on the sensing of the first set of memory cells. The one or more control circuits are configured to determine whether memory cells in the second set of memory cells have a threshold voltage less than a minimum target threshold voltage for the second data state based on the sensing of the second set of memory cells. The minimum target threshold voltage is greater than the maximum target threshold voltage.

In a further embodiment, the one or more control circuits are further configured to determine at least one count based on sensing the first set of memory cells and the second set of memory cells. The at least one count includes memory cells in the first set having a threshold voltage above the maximum target threshold voltage and memory cells in the second set having a threshold voltage below the minimum target threshold voltage.

In a further embodiment, the at least one count includes a total count of a first number of memory cells in the first set having a threshold voltage above the maximum target threshold voltage and a second number of memory cells in the second set having a threshold voltage below the minimum target threshold voltage.

In a further embodiment, the at least one count includes: a first count of a first number of memory cells in the first set having a threshold voltage above the maximum target threshold voltage, and a second count of a second number of memory cells in the second set having a threshold voltage below the minimum target threshold voltage.

In a further embodiment, the one or more control circuits are further configured to store an indication that a first memory cell in the first set has been programmed to the first state in response to the first memory cell passing program verify for the first state. the one or more control circuits are further configured to inhibit the first memory cell from programming while applying the program voltage to the selected word line in response to the indication that the first memory has been programmed to the first state. The one or more control circuits are further configured to over-ride an indication that the first memory cell should be locked out from sensing due to its inhibit status to enable a test of whether the first memory cells has the threshold voltage greater than the maximum target threshold voltage for the first data state.

In a further embodiment, the one or more control circuits are further configured to apply a first voltage to a first set of the bit lines connected to first NAND strings having the first set of memory cells while applying the reference voltage to the selected word line. The one or more control circuits are further configured to apply a second voltage to a second set of the bit lines connected to second NAND strings having the second set of memory cells while applying the reference voltage to the selected word line. The second voltage has as different magnitude than the first voltage to result in a first effective reference level for the first set of memory cells and a second effective reference level for the second set of memory cells.

In a further embodiment, the first voltage has a smaller magnitude than a magnitude of the second voltage, the reference voltage applied to the selected word line in combination with the second voltage applied to the second bit lines tests for the minimum target threshold voltage for the second data state, and the reference voltage applied to the selected word line in combination with the first voltage applied to the first bit lines tests for the maximum target threshold voltage for the first data state.

In a further embodiment, the first voltage has a greater magnitude than a magnitude of the second voltage, the reference voltage applied to the selected word line in combination with the second voltage applied to the second bit lines tests for the minimum target threshold voltage for the second data state, and the reference voltage applied to the selected word line in combination with the first voltage applied to the first bit lines tests for the maximum target threshold voltage for the first data state.

In a further embodiment, the first data state is associated with a first threshold voltage distribution that is immediately adjacent to a second threshold voltage distribution associated with the second data state.

In a further embodiment, the first data state is associated with a first threshold voltage distribution, the second data state is associated with a second threshold voltage distribution, and the one or more control circuits are further configured to program a third set of the memory cells connected to the selected word line to a third data state associated with a third threshold voltage distribution that is between the first threshold voltage distribution and the threshold voltage distribution.

In a further embodiment, the first data state is a first programmed state and the second data state is a second programmed state.

In a further embodiment, the first data state is an erased state and the second data state is a programmed state.

An embodiment includes a method for operating non-volatile storage. The method comprises applying a program voltage to a word line connected to a first set of memory cells on first NAND strings and a second set of memory cells on second NAND strings. The first set of memory cells are targeted for programming to a first data state and the second set of memory cells are targeted for programming to a second data state. The method comprises applying a reference voltage to the word line after applying the program voltage. The method comprises sensing the first set of memory cells and the second set of memory cells in response to applying the reference voltage. The method comprises determining at least one fail bit count based on sensing the first set of memory cells and the second set of memory cells, the at least one fail bit count includes over-programmed memory cells in the first set and memory cells in the second set that have not yet been programmed to the second data state.

An embodiment includes a non-volatile storage system. The system comprises a three-dimensional memory structure having NAND strings, word lines, and bit lines. The word lines are connected to memory cells on the NAND strings. The bit lines are connected to the NAND strings. The system comprises one or more control circuits configured to connect to the three-dimensional memory structure.

The one or more control circuits configured to apply a first program voltage to a selected word line connected to a selected group of memory cells on a set of the NAND strings. The selected group of memory cells includes a first set of memory cells targeted for programming to a first data state and a second set of memory cells targeted for programming to a second data state. The first data state has a first target threshold voltage distribution that is lower than a second target threshold voltage distribution of the second data state. The one or more control circuits is configured to verify whether memory cells in the first set of memory cells are programmed to the first data state in response to the first program voltage. The one or more control circuits is configured to apply a second program voltage to the selected word line after verifying whether memory cells in the first set of memory cells are programmed to the first data state. The one or more control circuits is configured to simultaneously verify whether memory cells in the second set of memory cells are programmed to the second data state in response to the second program voltage while determining whether memory cells in the first set are over-programmed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure having NAND strings, word lines, and bit lines, wherein the word lines are connected to memory cells on the NAND strings, wherein the bit lines are connected to the NAND strings, the one or more control circuits configured to:
apply a program voltage to a selected word line connected to a group of memory cells on a set of the NAND strings, the group of memory cells including a first set of memory cells targeted for a first data state and a second set of memory cells targeted for programming to a second data state;

apply a reference voltage to the selected word line following applying the program voltage;

apply a first voltage to a first set of the bit lines connected to first NAND strings having the first set of memory cells while applying the reference voltage to the selected word line;

apply a second voltage to a second set of the bit lines connected to second NAND strings having the second set of memory cells while applying the reference voltage to the selected word line, wherein the second voltage has a different magnitude than the first voltage to result in a first effective reference level for the first set of memory cells and a second effective reference level for the second set of memory cells;

sense the first set of memory cells and the second set of memory cells in response to applying the reference voltage to the selected word line;

determine whether memory cells in the first set of memory cells have a threshold voltage greater than a maximum target threshold voltage for the first data state based on the sensing of the first set of memory cells; and determine whether memory cells in the second set of memory cells have a threshold voltage less than a minimum target threshold voltage for the second data state based on the sensing of the second set of memory cells, wherein the minimum target threshold voltage is greater than the maximum target threshold voltage.

2. The apparatus of claim 1, wherein the one or more control circuits are configured to:

determine at least one count based on sensing the first set of memory cells and the second set of memory cells, the at least one count includes memory cells in the first set having a threshold voltage above the maximum target threshold voltage and memory cells in the second set having a threshold voltage below the minimum target threshold voltage.

3. The apparatus of claim 2, wherein the at least one count includes a total count of a first number of memory cells in the first set having a threshold voltage above the maximum target threshold voltage and a second number of memory cells in the second set having a threshold voltage below the minimum target threshold voltage.

4. The apparatus of claim 2, wherein the at least one count includes:

a first count of a first number of memory cells in the first set having a threshold voltage above the maximum target threshold voltage; and a second count of a second number of memory cells in the second set having a threshold voltage below the minimum target threshold voltage.

5. The apparatus of claim 1, wherein the one or more control circuits are further configured to:

store an indication that a first memory cell in the first set has been programmed to the first data state in response to the first memory cell passing program verify for the first data state;

inhibit the first memory cell from programming while applying the program voltage to the selected word line in response to the indication that the first memory has been programmed to the first data state; and over-ride an indication that the first memory cell should be locked out from sensing due to its inhibit status to enable a test of whether the first memory cells has the threshold voltage greater than the maximum target threshold voltage for the first data state.

6. The apparatus of claim 1, wherein:

the first voltage has a smaller magnitude than a magnitude of the second voltage;

the reference voltage applied to the selected word line in combination with the second voltage applied to the second bit lines tests for the minimum target threshold voltage for the second data state; and the reference voltage applied to the selected word line in combination with the first voltage applied to the first bit lines tests for the maximum target threshold voltage for the first data state.

7. The apparatus of claim 1, wherein:

the first voltage has a greater magnitude than a magnitude of the second voltage;

the reference voltage applied to the selected word line in combination with the second voltage applied to the second bit lines tests for the minimum target threshold voltage for the second data state; and the reference voltage applied to the selected word line in combination with the first voltage applied to the first bit lines tests for the maximum target threshold voltage for the first data state.

8. The apparatus of claim 1, wherein:

the first data state is associated with a first threshold voltage distribution that is immediately adjacent to a second threshold voltage distribution associated with the second data state.

9. The apparatus of claim 1, wherein:

the first data state is associated with a first threshold voltage distribution;

the second data state is associated with a second threshold voltage distribution; and the one or more control circuits are further configured to program a third set of the memory cells connected to the selected word line to a third data state associated with a third threshold voltage distribution that is between the first threshold voltage distribution and the second threshold voltage distribution.

10. The apparatus of claim 1, wherein the first data state is a first programmed state and the second data state is a second programmed state.

11. The apparatus of claim 1, wherein the first data state is an erased state and the second data state is a programmed state.

12. A method for operating non-volatile storage, the method comprising:

applying a program voltage to a word line connected to a first set of memory cells on first NAND strings and a second set of memory cells on second NAND strings, the first set of memory cells targeted for programming to a first data state and the second set of memory cells targeted for programming to a second data state;

applying a reference voltage to the word line after applying the program voltage;

applying a first voltage to a first set of bit lines connected to the first NAND strings while applying the reference voltage to the word line;

applying a second voltage to a second set of bit lines connected to the second NAND strings while applying the reference voltage to the word line, the second voltage having a different magnitude than the first voltage to result in a first effective reference level for the first set of memory cells and a second effective reference level for the second set of memory cells;

sensing the first set of memory cells and the second set of memory cells in response to applying the reference voltage; and determining at least one fail bit count based on sensing the first set of memory cells and the second set of memory cells, the at least one fail bit count includes over-programmed memory cells in the first set and memory cells in the second set that have not yet been programmed to the second data state.

13. A non-volatile storage system, the system comprising:
a three-dimensional memory structure having NAND strings, word lines, and bit lines, wherein the word lines are connected to memory cells on the NAND strings, wherein the bit lines are connected to the NAND strings; and
one or more control circuits configured to connect to the three-dimensional memory structure, the one or more control circuits configured to:
apply a first program voltage to a selected word line connected to a selected group of memory cells on a set of the NAND strings, the selected group of memory cells including a first set of memory cells targeted for programming to a first data state and a second set of memory cells targeted for programming to a second data state, wherein the first data state has a first target threshold voltage distribution that is lower than a second target threshold voltage distribution of the second data state;
verify whether memory cells in the first set of memory cells are programmed to the first data state in response to the first program voltage;
store an indication that a first memory cell in the first set has been programmed to the first data state in response to the first memory cell passing program verify after applying the first program voltage;
apply a second program voltage to the selected word line after verifying whether memory cells in the first set of memory cells are programmed to the first data state;
inhibiting the first memory cell from programming while applying the second program voltage to the selected word line in response to the indication that the first memory has been programmed to the first data state;
over-ride the indication that the first memory cell has been programmed to the first data state to enable determining whether the first memory cell is over-programmed while simultaneously verifying whether memory cells in the second set of memory cells are programmed to the second data state; and
simultaneously verify whether memory cells in the second set of memory cells are programmed to the second data state in response to the second program voltage while determining whether memory cells in the first set are over-programmed.

14. The non-volatile storage system of claim 13, wherein to simultaneously verify whether memory cells in the second set of memory cells are programmed to the second data state while determining whether memory cells in the first set are over-programmed the one or more control circuits configured to:
apply a reference voltage to the selected word line after applying the second program voltage to the selected word line;
sense the first set of memory cells and the second set of memory cells in response to applying the reference voltage; and
determine a fail bit count based on sensing the first set of memory cells and the second set of memory cells, the fail bit count includes over-programmed memory cells targeted for programming to the first data state.

15. The non-volatile storage system of claim 14, wherein the fail bit count further includes memory cells targeted for programming to the second data state that have not yet reached the second data state after applying the second program voltage.

16. The non-volatile storage system of claim 14, wherein to sense the first set of memory cells and the second set of memory cells in response to applying the reference voltage the one or more control circuits are further configured to:
apply a first voltage to a first set of the bit lines connected to first NAND strings having the first set of memory cells while applying the reference voltage to the selected word line; and
apply a second voltage to a second set of the bit lines connected to second NAND strings having the second set of memory cells while applying the reference voltage to the selected word line, wherein the second voltage has a different magnitude than the first voltage to result in a first effective reference level for the first set of memory cells and a second effective reference level for the second set of memory cells.

17. The non-volatile storage system of claim 13, wherein to simultaneously verify whether memory cells in the second set of memory cells are programmed to the second data state in response to the second program voltage while determining whether memory cells in the first set are over-programmed the one or more control circuits are configured to determine one or more counts that include:
memory cells in the first set that fail to conduct a significant current in response to reference voltage applied to the selected word line; and
memory cells in the second set that conduct a significant current in response to the reference voltage applied to the selected word line.

* * * * *